United States Patent
Minamio et al.

(12) 
(10) Patent No.: US 6,667,541 B1
(45) Date of Patent: Dec. 23, 2003

(54) TERMINAL LAND FRAME AND METHOD FOR MANUFACTURING THE SAME

(75) Inventors: Masanori Minamio, Osaka (JP); Osamu Adachi, Kyoto (JP); Toru Nomura, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/419,879

(22) Filed: Oct. 15, 1999

(30) Foreign Application Priority Data

Oct. 21, 1998 (JP) .......................... 10-299388
Oct. 21, 1998 (JP) .......................... 10-299389
Oct. 21, 1998 (JP) .......................... 10-299390

(51) Int. Cl.⁷ .......................................... H01L 23/495
(52) U.S. Cl. ..................... 257/666; 257/686; 257/687; 257/693
(58) Field of Search ................. 257/676, 693, 257/666, 671, 672, 674, 685, 686, 687

(56) References Cited

U.S. PATENT DOCUMENTS 6,025,650 A * 2/2000 Tsuji et al. ............... 257/668
6,258,630 B1 * 7/2001 Kawahara ................ 438/122
6,348,726 B1 * 2/2002 Bayan et al. ............. 257/666

FOREIGN PATENT DOCUMENTS

| JP | 57-80750 | | 5/1982 |
| JP | 2-271652 | | 11/1990 |
| JP | 404162765 A | * | 6/1992 |
| JP | 5-129473 | | 5/1993 |
| JP | 6-275764 | | 9/1994 |
| JP | 10-256460 | | 9/1998 |

* cited by examiner

*Primary Examiner*—Wael Fahmy
*Assistant Examiner*—Nathan W. Ha
(74) *Attorney, Agent, or Firm*—Nixon Peabody LLP; Donald R. Studebaker

(57) ABSTRACT

A terminal land frame includes a frame body and a plurality of lands. Each of these lands is formed out of the frame body to be connected to the frame body via a thinned portion and protrude therefrom. When the lands are pressed in a direction in which the lands protrude from the frame body, the thinned portions are fractured and the lands are easily separable from the frame body. A semiconductor chip is mounted on some of the lands of the terminal land frame, and the chip, wires and so on, are single-side-molded with a resin encapsulant. Thereafter, when the lands are pressed on the bottom, the lands are separated from the frame body. As a result, a structure, in which the lower part of each of these lands protrudes downward from the lower surface of the resin encapsulant, is obtained, and that protruding portion is used as an external electrode. In this manner, a downsized and thinned resin-molded semiconductor device is provided at a lower cost and with higher reliability.

16 Claims, 16 Drawing Sheets

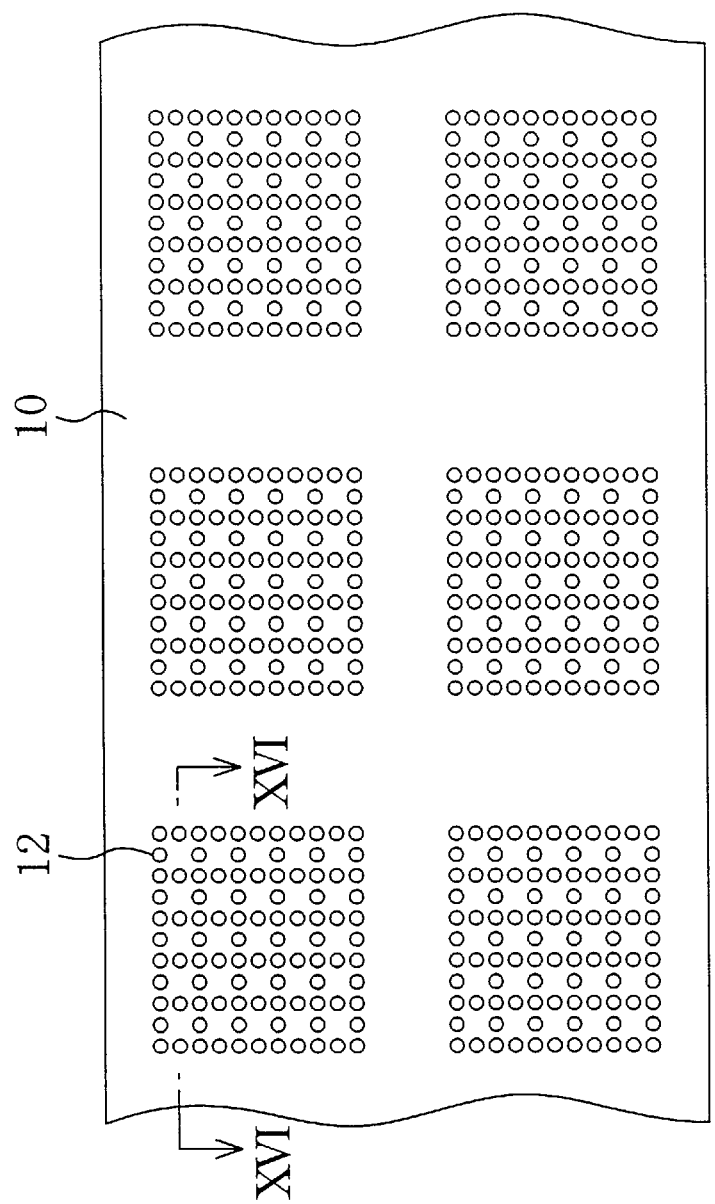

US 6,667,541 B1

TERMINAL LAND FRAME AND METHOD FOR MANUFACTURING THE SAME

BACKGROUND OF THE INVENTION

The present invention relates to a terminal land frame, which substitutes for a conventional leadframe with radial leads and includes lands functioning as external terminals, and also relates to a method for manufacturing the same.

In recent years, to catch up with rapidly advancing downsizing of electronic units, it has become increasingly necessary to assemble semiconductor components, like resin-molded semiconductor devices, at a higher and higher density. Correspondingly, sizes and thicknesses of semiconductor components have also been noticeably reduced. In parallel with this downsizing trend, the number of pins required for a single electronic unit is also increasing day after day. To meet these demands, resin-molded semiconductor devices of a greatly reduced size and with a drastically reduced thickness should now be assembled at an even higher density.

Hereinafter, a conventional leadframe for a resin-molded semiconductor device will be described.

FIG. 24 is a plan view illustrating the structure of a conventional leadframe. As shown in FIG. 24, the conventional leadframe includes: a rectangular die pad 102; support leads 103; radial inner leads 104; outer leads 105; and tie bars 106, all of these members being provided inside a frame rail 101. The die pad 102 is used for mounting a semiconductor chip thereon. The support leads 103 support the die pad 102. The inner leads 104 are electrically connected to the semiconductor chip mounted with some connection means like metal fine wires. The outer leads 105 are joined to the respective inner leads 104 and to be connected to external terminals. The tie bars 106 are provided for joining and fixing the outer leads 105 together and for preventing the overflow of a resin encapsulant during a resin molding process.

It should be noted that an ordinary leadframe does not consist of a single pattern such as that shown in FIG. 24, but is made up of a plurality of such patterns, which are arranged to be connected together both horizontally and vertically.

Next, a conventional resin-molded semiconductor device will be described. FIG. 25 is a cross-sectional view illustrating a resin-molded semiconductor device using the leadframe shown in FIG. 24.

As shown in FIG. 25, a semiconductor chip 107 is mounted on the die pad 102 of the leadframe. The semiconductor chip 107 is electrically connected to the inner leads 104 via metal fine wires 108. The semiconductor chip 107 on the die pad 102 and the inner leads 104 are encapsulated with a resin encapsulant 109. The outer leads 105 protrude from the sides of the resin encapsulant 109 and the ends thereof are bent downward.

Next, a method for manufacturing the conventional resin-molded semiconductor device will be described with reference to FIG. 26. First, the semiconductor chip 107 is bonded, with an adhesive, onto the die pad 102 of the leadframe. This process step is called "die bonding". Next, the semiconductor chip 107 is connected to the respective ends of the inner leads 104 via the metal fine wires 108. This process step is called "wire bonding". Subsequently, the semiconductor chip 107 and a portion of the leadframe inside the tie bars 106 (i.e., the inner leads 104 and so on) are molded with the resin encapsulant 109 such that the outer leads 105 protrude outward. This process step is called "resin molding". Finally, portions slightly inside the tie bars 106 are cut off to separate the outer leads 105 from each other and remove the frame rail 101, and the respective ends of the outer leads 105 are bent. This process step is called "tie bar cutting and bending". As a result, a resin-molded semiconductor device with the structure shown in FIG. 25 is completed. In FIG. 26, a region surrounded by the dashed line is to be molded with the resin encapsulant 109.

As described above, the number of devices that should be integrated within a single semiconductor chip, or the number of pins per chip, has been on the rise these days. In other words, the number of outer leads should also be increased to catch up with the latest trend. That is to say, the number of the inner leads, which are joined to the outer leads, should preferably be increased to cope with such an implementation. However, the width of the inner (or outer) lead has a processable limit. Thus, as the number of inner leads is increased, the overall size of the leadframe and that of the resulting resin-molded semiconductor device also increase. That is to say, it is difficult to realize a downsized and thinned resin-molded semiconductor device in such a case. On the other hand, if only the number of inner leads is increased to cope with the rise in number of pins of a semiconductor chip while using a leadframe of substantially the same size, then the width of a single inner lead should be further reduced. In such a case, it becomes more difficult to perform various process steps for forming the leadframe, like etching, as originally designed.

Recently, semi-face-mount semiconductor devices, such as ball grid array (BGA) types and land grid array (LGA) types, are also provided. A semiconductor device of such a type is mounted directly on a motherboard on the bottom. Specifically, first, a semiconductor chip is mounted on a carrier (i.e., a printed wiring board) including external electrodes on the bottom thereof. Next, the semiconductor chip is electrically connected to the external electrodes. And then the chip is molded with a resin on the upper surface of the carrier. The semiconductor devices of this face-mount type, which is mounted directly on a motherboard on the bottom, will be mainstream products in the near future. Accordingly, it is now clear that the conventional leadframe and resin-molded semiconductor device using the leadframe will soon be out of date under the circumstances such as these.

Also, the conventional resin-molded semiconductor device includes outer leads protruding outward from the sides of a resin encapsulant, and is supposed to be mounted onto a motherboard by bonding the outer leads to the electrodes of the motherboard. Accordingly, the conventional device cannot be mounted onto the board so reliably as the semiconductor devices of BGA and LGA types. Nevertheless, the semiconductor devices of the BGA and LGA types are more expensive, because these devices use a printed wiring board. That is to say, it is difficult for any of these conventional types of semiconductor devices to attain high reliability at a low cost.

SUMMARY OF THE INVENTION

An object of the present invention is providing a highly reliable resin-molded semiconductor device at a low cost by taking various measures to mount a semiconductor device onto a board on the bottom using a frame structure.

To achieve this object, the present inventors take a novel approach, which is totally different from that of the conventional leadframe structure. Specifically, the principal feature of the present invention lies in a frame structure including a plurality of "lands" to be external electrodes, which substitute for the radial "leads" that have heretofore been adopted widely.

Another object of the present invention is manufacturing a resin-molded semiconductor device more easily and at a lower cost by eliminating the process steps of cutting and bending the leads.

A first exemplary terminal land frame according to the present invention includes: a frame body; a plurality of lands, each said land being substantially as thick as the frame body, at least part of each said land protruding out of the frame body; and a plurality of thinned portions, each said thinned portion connecting the frame body to associated one of the lands and being thinner than the frame body or the lands. When each said land is pressed in a direction in which the land protrudes, associated one of the thinned portions is fractured and the land is separable from the frame body.

A terminal land frame with such a structure is applicable to manufacturing a resin-molded semiconductor device in which part of each land, which protrudes from the lower surface of a resin encapsulant, can be used as an external electrode.

In one embodiment of the present invention, the top of that part of each said land, which protrudes from the frame body, is preferably laterally expanded and shaped like a mushroom.

In another embodiment, the frame body, the lands and the thinned portions are preferably all made of a single metal plate.

In still another embodiment, the top face of the part of each said land, which protrudes from the frame body, is preferably greater in area than another face of the land, which is opposite to the top face. And the top face preferably has curved edges.

A second exemplary terminal land frame according to the present invention includes: a frame body; a die pad being substantially as thick as the frame body and including a first part protruding out of the frame body; a plurality of lands, each said land being substantially as thick as the frame body and including a second part protruding out of the frame body; a first thinned portion connecting the frame body and the die pad together and being thinner than the frame body or the die pad; and a plurality of second thinned portions, each said second thinned portion connecting the frame body to associated one of the lands and being thinner than the frame body or the lands. When the die pad and each said land are pressed in a direction in which the die pad and the land protrude, the first thinned portion and associated one of the second thinned portions are fractured and the die pad and the land are separable from the frame body.

A terminal land frame including a die pad can also attain the same effects as those of the first terminal land frame.

The same preferred embodiments as those applied to the first terminal land frame are also applicable to the second terminal land frame.

A first exemplary method for manufacturing a terminal land frame according to the present invention includes the steps of: a) placing a metal plate, which will be wrought into a frame body, on a blanking die and pressing the metal plate downward with a presser die; and b) pressing a plurality of parts of the metal plate downward with a blanking member such that each of these parts pressed protrudes out of the body of the metal plate into associated one of openings of the blanking die, thereby forming a plurality of lands out of these parts and forming a plurality of half-cut thinned portions connecting the lands to the metal plate body.

According to the first method, the first terminal land frame of the present invention can be manufactured easily.

In one embodiment of the present invention, the blanking member preferably has a plurality of punches in the step a), each having a cross-sectional area smaller than that of associated one of the openings of the blanking die. And the step b) is preferably performed such that the top face of each said part, which protrudes from the metal plate body, is greater in area than another face of the part, which is opposite to the top face, and that the top face of each said part has curved edges.

A second exemplary method for manufacturing a terminal land frame according to the present invention includes the steps of: a) placing a metal plate, which will be wrought into a frame body, on a blanking die and pressing the metal plate downward with a presser die; and b) pressing a first region and a plurality of second regions of the metal plate downward with a blanking member such that a first part at the first region and a second part at each said second region protrude out of the body of the metal plate into associated openings of the blanking die, thereby forming a die pad at the first region, a half-cut first thinned portion connecting the die pad to the metal plate body, a plurality of lands at the second regions and a plurality of half-cut second thinned portions connecting the lands to the metal plate body.

According to the second method, the second terminal land frame of the present invention can be manufactured easily.

In one embodiment of the present invention, the blanking member preferably has a plurality of punches in the step a), each having a cross-sectional area smaller than that of associated one of the openings of the blanking die. The step b) is preferably performed such that the top face of the first part at the first region is greater in area than another face of the first part, which is opposite to the top face, and that the top face of the first part has curved edges. And the step b) is also preferably performed such that the top face of the second part at each said second region is greater in area than another face of the second part, which is opposite to the top face, and that the top face of the second part has curved edges.

A first resin-molded semiconductor device according to the present invention is formed by using a terminal land frame, which includes: a metallic frame body; a plurality of lands including first and second groups of lands, each said land being substantially as thick as the frame body, at least part of each said land protruding out of the frame body; and a plurality of thinned portions, each said thinned portion connecting the frame body to associated one of the lands and being thinner than the frame body or the lands. The semiconductor device includes: a semiconductor chip being mounted on the first group of lands and having a plurality of electrode pads; a plurality of connection members, each said connection member electrically connecting each said land of the second group to associated one of the electrode pads; and a resin encapsulant for molding the semiconductor chip, the connection members and respective upper halves of the lands, each said upper half corresponding to the part of the associated land that protrudes out of the frame body. The lower half of each said land other than the upper half thereof is not covered with the resin encapsulant but protrudes downward out of the lower surface of the resin encapsulant.

In this structure, the lower halves of the lands protruding out of the lower surface of the resin encapsulant can be used as the external electrodes, which can be disposed at arbitrary positions on the lower surface of the resin-molded semiconductor device. Thus, a highly reliable, thinned and downsized resin-molded semiconductor device can be manufactured at a lower cost by a high-density mount technique.

In one embodiment of the present invention, the top face of the upper half of each said land, which is buried in the resin encapsulant, is preferably greater in area than the bottom face of the lower half thereof, and the top face of the upper half preferably has curved edges.

A second resin-molded semiconductor device according to the present invention is formed by using a terminal land frame, which includes: a metallic frame body; a die pad being substantially as thick as the frame body and including a first part protruding out of the frame body; a plurality of lands, each said land being substantially as thick as the frame body and including a second part protruding out of the frame body; a first thinned portion connecting the frame body and the die pad together and being thinner than the frame body or the die pad; and a plurality of second thinned portions, each said second thinned portion connecting the frame body to associated one of the lands and being thinner than the frame body or the lands. The semiconductor device includes: a semiconductor chip being mounted on the die pad and having a plurality of electrode pads; a plurality of connection members, each said connection member electrically connecting each said land to associated one of the electrode pads of the semiconductor chip; and a resin encapsulant for molding the semiconductor chip, the connection members, a first upper half corresponding to the first part of the die pad protruding out of the frame body, and respective second upper halves corresponding to the second parts of the lands protruding out of the frame body. A first lower half, which is the remaining portion of the die pad other than the first upper half, and second lower halves, each of which is the remaining portion of associated one of the lands other than associated one of the second upper halves, are not covered with the resin encapsulant but protrude downward out of the lower surface of the resin encapsulant.

A resin-molded semiconductor device with such a structure can dissipate a sufficient amount of heat using the die pad and can also attain the same effects as those of the first resin-molded semiconductor device.

In one embodiment of the present invention, the top face of the first upper half of the die pad, which is buried in the resin encapsulant, is preferably greater in area than the bottom face of the first lower half thereof, and the top face of the first upper half preferably has curved edges. The top face of the second upper half of each said land, which is buried in the resin encapsulant, is preferably greater in area than the bottom face of the second lower half thereof, and the top face of the second upper half preferably has curved edges.

A third resin-molded semiconductor device according to the present invention is formed by using a terminal land frame, which includes: a metallic frame body; a plurality of lands, each said land being substantially as thick as the frame body, at least part of each said land protruding out of the frame body; and a plurality of thinned portions, each said thinned portion connecting the frame body to associated one of the lands and being thinner than the frame body or the lands. The semiconductor device includes: a semiconductor chip being mounted on the lands and having a plurality of electrode pads connected to the lands; and a resin encapsulant for molding the semiconductor chip and respective upper halves of the lands, each said upper half corresponding to the part of the associated land that protrudes out of the frame body. The lower half of each said land other than the upper half thereof is not covered with the resin encapsulant but protrudes downward out of the lower surface of the resin encapsulant.

A resin-molded semiconductor device with such a flip-chip mounted structure can attain the same effects as those of the first resin-molded semiconductor device.

In one embodiment of the present invention, the top face of the upper half of each said land, which is buried in the resin encapsulant, is preferably greater in area than the bottom face of the lower half thereof, and the top face of the upper half preferably has curved edges.

In another embodiment, the third resin-molded semiconductor device preferably further includes: the same number of protruding electrodes as that of the electrode pads of the semiconductor chip, each said protruding electrode being formed on associated one of the electrode pads; and a conductive adhesive for electrically connecting the protruding electrodes to the lands.

A first method for manufacturing a resin-molded semiconductor device according to the present invention includes the step of a) preparing a terminal land frame, which includes: a frame body; a plurality of lands including first and second groups of lands, each said land being substantially as thick as the frame body, at least part of each said land protruding out of the frame body; and a plurality of thinned portions, each said thinned portion connecting the frame body to associated one of the lands and being thinner than the frame body or the lands. When each said land is pressed in a direction in which the land protrudes, associated one of the thinned portions is fractured and the land is separable from the frame body. The method further includes the steps of: b) mounting a semiconductor chip on respective top faces of the protruding parts of the first group of lands; c) electrically connecting the lands of the second group to associated electrode pads of the semiconductor chip via a plurality of connection members; d) molding the semiconductor chip, the connection members and the upper half of the terminal land frame, including the respective parts of the lands protruding out of the frame body, with a resin encapsulant; and e) applying force in such a direction as separating the respective members molded with the resin encapsulant, including the lands, from the frame body, thereby separating a resin-molded semiconductor device, in which respective lower halves of the lands other than the protruding parts thereof are not covered with the resin encapsulant but protrude downward from the lower surface of the resin encapsulant, from the frame body.

According to this method, the first resin-molded semiconductor device can be manufactured easily while preventing resin bur from reaching the bottoms of the lands during resin molding and ensuring a standoff height large enough to use the lands as external electrodes.

In one embodiment of the present invention, respective faces of at least part of the lands, which faces are opposite to the top faces of the protruding parts of the lands, are preferably pressed toward the top faces in the step e).

A second method for manufacturing a resin-molded semiconductor device according to the present invention includes the steps of: a) preparing a terminal land frame, which includes: a metallic frame body; a die pad being substantially as thick as the frame body and including a first part protruding out of the frame body; a plurality of lands, each said land being substantially as thick as the frame body and including a second part protruding out of the frame body; a first thinned portion connecting the frame body and the die pad together and being thinner than the frame body or the die pad; and a plurality of second thinned portions, each said second thinned portion connecting the frame body to associated one of the lands and being thinner than the frame body or the lands; b) mounting a semiconductor chip on the top face of the protruding first part of the die pad; c) electrically connecting the lands to associated electrode pads of the semiconductor chip via a plurality of connection members; d) molding the semiconductor chip, the connection members and the upper half of the terminal land frame, including the first part of the die pad and the second parts of the lands, with a resin encapsulant; and e) applying force in such a direction as separating the respective members molded with the resin encapsulant, including the die pad and the lands, from the frame body, thereby separating a resin-molded semiconductor device, in which a first lower half, which is the remaining portion of the die pad other than the first part, and second lower halves, each of which is the remaining portion of associated one of the lands other than associated one of the second parts, are not covered with the resin encapsulant but protrude downward from the lower surface of the resin encapsulant, from the frame body.

According to this method, the second resin-molded semiconductor device can be manufactured easily while preventing resin bur from reaching the bottoms of the lands during resin molding and ensuring a standoff height large enough to use the lands as external electrodes.

In one embodiment of the present invention, a face of the die pad, which face is opposite to the top face of the first part, is preferably pressed toward the top face, and respective faces of at least part of the lands, which faces are opposite to the top faces of the second parts, are preferably pressed toward the top faces in the step e).

A third method for manufacturing a resin-molded semiconductor device according to the present invention includes the step of a) preparing a terminal land frame, which includes: a metallic frame body; a plurality of lands, each said land being substantially as thick as the frame body, at least part of each said land protruding out of the frame body; and a plurality of thinned portions, each said thinned portion connecting the frame body to associated one of the lands and being thinner than the frame body or the lands. When each said land is pressed in a direction in which the land protrudes, associated one of the thinned portions is fractured and the land is separable from the frame body. The method further includes the steps of: b) mounting a semiconductor chip on respective top faces of the protruding parts of the lands, thereby electrically connecting the lands to associated electrode pads of the semiconductor chip; c) molding the semiconductor chip and the upper half of the terminal land frame, including the respective parts of the lands protruding out of the frame body, with a resin encapsulant; and d) applying force in such a direction as separating the respective members molded with the resin encapsulant, including the lands, from the frame body, thereby separating a resin-molded semiconductor device, in which respective lower halves of the lands other than the protruding parts thereof are not covered with the resin encapsulant but protrude downward from the lower surface of the resin encapsulant, from the frame body.

According to this method, the third resin-molded semiconductor device can be manufactured easily while preventing resin bur from reaching the bottoms of the lands during resin molding and ensuring a standoff height large enough to use the lands as external electrodes.

In one embodiment of the present invention, respective faces of at least part of the lands, which faces are opposite to the top faces of the protruding parts of the lands, are preferably pressed toward the top faces in the step d).

In another embodiment, protruding electrodes, which are formed on the respective electrode pads of the semiconductor chip, are preferably electrically connected to the lands with a conductive adhesive in the step b).

BRIEF DESCRIPTION OF THE DRAWINGS

FIG. 15 is a plan view of a terminal land frame according to a third embodiment of the present invention.

DESCRIPTION OF THE PREFERRED EMBODIMENTS

Embodiment 1

Figure 1:
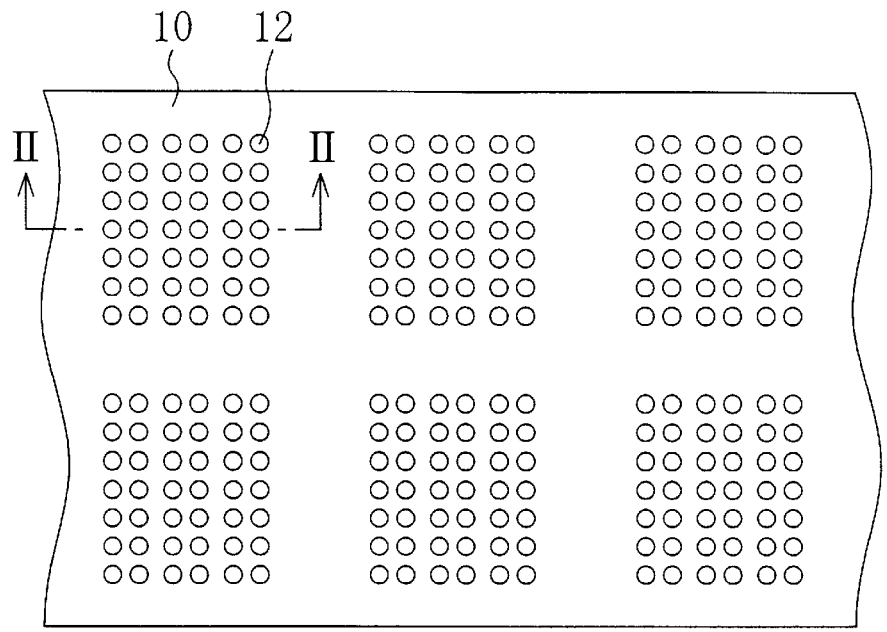
FIG. 1 is a plan view of a terminal land frame according to a first embodiment of the present invention.
Figure 2:
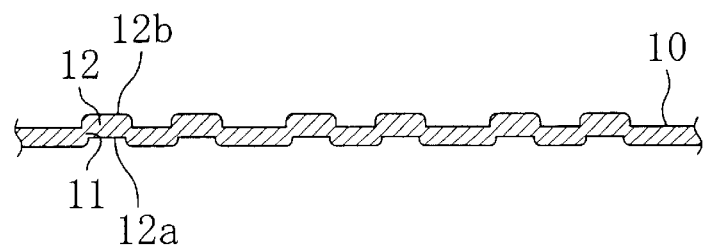
FIG. 2 is a cross-sectional view of the frame taken along the line II—II in FIG. 1.
Figure 3:
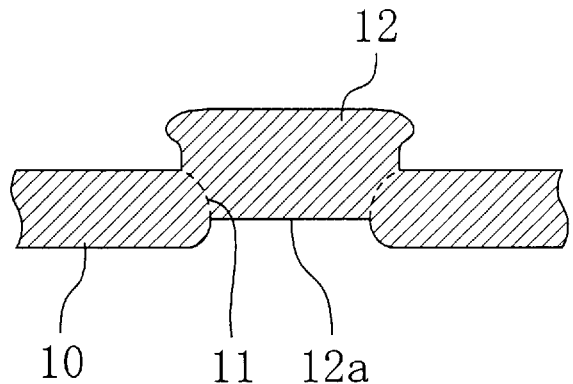
FIG. 3 is a cross-sectional view illustrating a land shown in FIG. 2 to a larger scale.

FIG. 1 is a plan view of a terminal land frame according to a first embodiment of the present invention. FIG. 2 is a cross-sectional view of the frame taken along the line II—II shown in FIG. 1. FIG. 3 is a cross-sectional view illustrating a land shown in FIG. 2 to a larger scale.

As shown in FIGS. 1 through 3, a terminal land frame according to the first embodiment includes a frame body 10, which is a metal plate made of copper or Alloy 42 that is used widely for leadframes. The terminal land frame further includes a plurality of lands 12, which are arranged on the frame body 10 to form a matrix pattern, connected to the frame body 10 via respective thinned portions 11 and protrude upward out of the frame body 10. That is to say, the frame body 10, lands 12 and thinned portions 11 are all made of a single metal plate. The terminal land frame is formed in such a manner that when a land 12 is pressed upward on the bottom 12a, the thinned portion 11 is fractured and the land 12 is separable from the frame body 10. Also, as shown in FIG. 1, a large number of lands 12 are arranged to form a matrix pattern in its planar layout. Alternatively, these lands 12 may be arranged to form a hound's-tooth check or checkerboard fashion or may be arranged at random in its planar layout. That is to say, any arbitrary arrangement may be employed so long as the arrangement is suitable for connecting the lands to a semiconductor chip to be mounted thereon via metal fine wires.

As shown in FIG. 3, when the land 12 is pressed on the bottom 12a in such a direction as protruding the land 12 upward, the thinned portion 11 as indicated by the broken line is fractured, and the land 12 is separated from the frame body 10. In this case, the thinned portion 11 is a "linkage portion" formed by half-blanking the frame body 10 itself using a half-cutting member. That is to say, when part of the frame body 10, in which a land is to be formed, is blanked using a blanking member, that part is not blanked through completely, but blanking is stopped preferably at around a midway point. As a result, that half-blanked part protrudes out of the frame body 10 to form the land 12. And a portion linking the land 12 to the frame body 10 is also formed as the thinned portion 11. Accordingly, the thinned portion 11 is so thin that when the land 12 is pressed on the bottom 12a in such a direction as protruding the land 12 upward, the thinned portion 11 is fractured easily.

The protrusion height of the land 12 as measured from the upper surface of the frame body 10 is a half or more of the thickness of the frame body 10 itself. That is to say, the frame body 10 is formed in such a manner that when a land 12 is pressed on the bottom 12a upward in FIG. 2, the thinned portion 11 is fractured and the land 12 is separable from the frame body 10.

For example, according to this embodiment, the thickness of the terminal land frame itself, i.e., the thickness of the frame body 10, may be 200 μm. On the other hand, the protrusion height of the land 12 may be in the range from 140 μm to 180 μm, which is 70 to 90% of the thickness of the frame body 10. It should be noted that the thickness of the frame body 10 does not have to be 200 μm, but may be about 400 μm if necessary. Also, according to this embodiment, the protrusion height of the land 12 is supposed to be a half or more of the thickness of the frame body, e.g., 70 to 90% of the thickness of the frame body. Alternatively, the protrusion height may be less than a half of the thickness of the frame body. At any rate, the protrusion height may be defined at such a value as making the thinned portion 11 fracturable upon the application of pressure.

Also, according to this embodiment, the terminal land frame is plated with a plurality of metal layers, e.g., nickel (Ni), palladium (Pd) and gold (Au) layers stacked one upon the other. In this manner, the terminal land frame may be plated if necessary. Plating the terminal land frame may be performed either after or before the metal plate is shaped to form the lands 12. Moreover, the roughness at the surface of the terminal land frame according to this embodiment is 0.1 μm or less. Although the surface of the terminal land frame never fails to get rugged by the formation of the lands 12, the surface roughness of the terminal land frame because of other reasons is preferably as small as possible. This is because the roughness affects the ease of peeling the terminal land frame from a resin during resin molding.

Furthermore, in the terminal land frame according to this embodiment, the top of the protruding part of the land 12 is somewhat expanded laterally as a result of a type of pressing called "coining". Accordingly, the upper surface of the land 12 is shaped flat like that of a mushroom. Thus, when a semiconductor chip is mounted on the terminal land frame and molded with a resin, the lands 12 can be held more strongly by the resin encapsulant because the lands 12 are shaped like mushrooms. As a result, the lands 12, can be in tighter contact with the resin encapsulant, thus realizing highly reliable resin molding in spite of the single-side-molded structure thereof. It is noted that the protruding part of the land 12 does not have to have its upper surface flattened like a mushroom, but may be in any arbitrary shape, e.g., like a crook, so long as the resin encapsulant can be anchored by the land 12.

The terminal land frame according to the present invention is not provided with any die pad, which is a member usually used for mounting a semiconductor chip thereon, on purpose. Instead, a number of the lands 12, which are provided in respective regions of the frame body 10, may be used as the die pad. That is to say, a semiconductor chip may be supported on a number of lands 12. Accordingly, the terminal land frame can mount a semiconductor chip of any type thereon even if the sizes thereof are different from each other. Specifically, an appropriate number of lands 12, which are selected from the group of lands depending on the size of a chip to be mounted, may be used for supporting the chip thereon, and the other lands 12 may be used to establish electrical connection with the semiconductor chip mounted. That is to say, the terminal land frame is commonly applicable to various types of resin-molded semiconductor devices. Also, even when semiconductor chips of different sizes are mounted on a single frame and then molded with a resin encapsulant at the same time, desired resin-molded semiconductor devices can be obtained at a time.

The number of the lands 12 may be appropriately defined depending on the number of pins of the semiconductor chip to be mounted. Also, as shown in FIG. 1, the lands 12 may be successively formed out of the frame body 10 both horizontally and vertically alike. Furthermore, the land 12 does not have to be circular as viewed from above, but may be polygonal or rectangular. All the lands 12 within the terminal land frame may be of the same size. Moreover, when a resin-molded semiconductor device is formed with this terminal land frame using the lands 12 as land electrodes, only some of the lands 12 located around the periphery may be larger than the other lands 12 to relax a stress, which is caused when the device is mounted onto a motherboard. The upper surface of the land 12 may be of such a size that a semiconductor chip can be bonded thereto via a metal fine wire like a gold wire. In this embodiment, the size may be 100 $\mu$m$\phi$ or more.

The terminal land frame according to the first embodiment includes none of the conventional members called "inner leads", "outer leads" and "die pad". Instead, the terminal land frame includes lands 12 functioning as land electrodes, which are arranged to form a matrix or hound's-tooth pattern in its planar layout. Thus, a resin-molded semiconductor device including land electrodes on its bottom can be obtained easily by using this terminal land frame as will be described in detail later. In addition, according to this embodiment, the members functioning as external electrodes of a resin-molded semiconductor device are not radial leads as in a conventional leadframe, but dotted lands 12. Thus, these lands 12 may be disposed at any arbitrary positions in the planar layout. Accordingly, these lands 12 may be placed more freely as the external electrodes for a resin-molded semiconductor device, and it is possible to cope with the increase in number of pins of a semiconductor chip. The arrangement pattern of the lands 12 is arbitrarily selectable in accordance with the number of pins of a semiconductor chip to be mounted. Thus, it is naturally possible to arrange the lands 12 in line as in the conventional leadframe.

Next, a method for manufacturing a terminal land frame according to this embodiment will be described.

Figure 4:
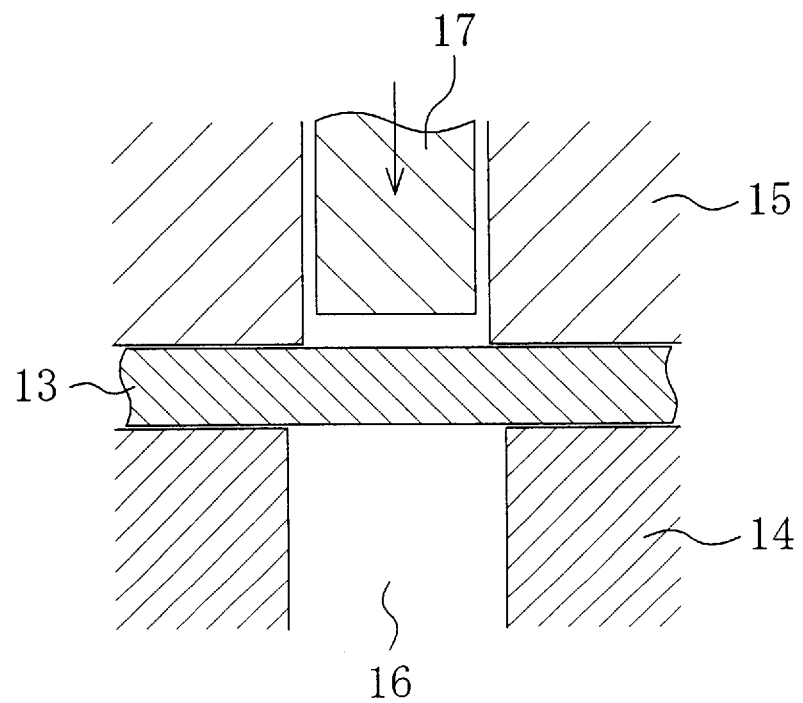
FIG. 4 is a cross-sectional view illustrating a state just before a half-blanking step is performed during a manufacturing process of a terminal land frame according to the present invention.
Figure 5:
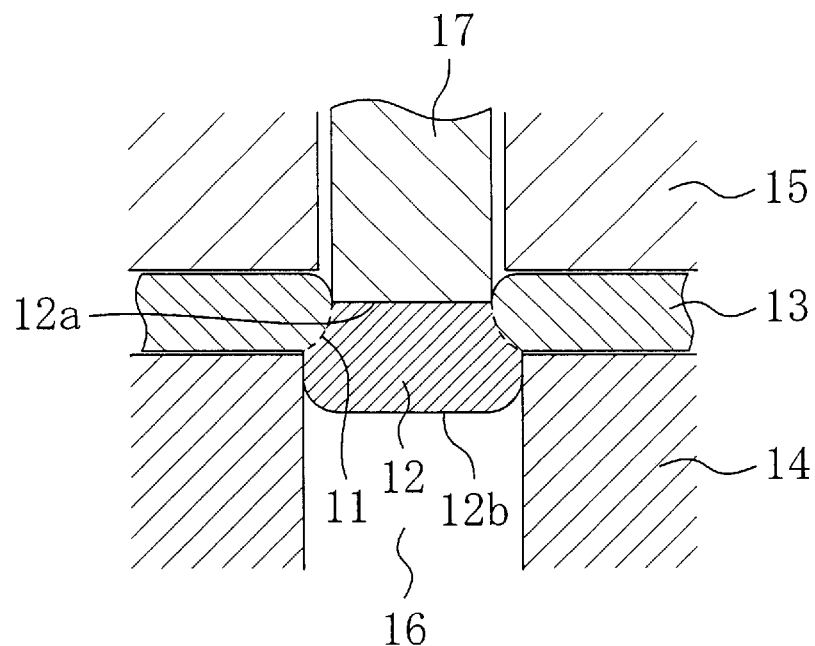
FIG. 5 is a cross-sectional view illustrating the half-blanking step during the manufacturing process of the terminal land frame according to the present invention.

FIGS. 4 and 5 are cross-sectional views illustrating how the land 12 is formed by a half-blanking step during a manufacturing process of the terminal land frame.

First, as shown in FIG. 4, a metal plate 13 to be wrought into the frame body of a terminal land frame is placed on a blanking die 14 and then pressed downward with a presser die 15. In FIG. 4, the die 14 is provided with an opening 16 to receive the blanked portion and a blanking member, which are both pressed downward. The blanking member 17 is disposed above the metal plate 13.

Next, as shown in FIG. 5, the metal plate 13, which has been fixed at a predetermined position on the die 14, is pressed downward with the blanking member 17. In this manner, part of the metal plate 13 is protruded into the opening 16 of the die 14 and portion of the metal plate 13, with which the blanking member 17 is now in contact, is half-cut, thereby forming the land 12. That is to say, the land 12 is formed to remain connected to the metal plate 13 via the thinned portion 11 and to protrude from the body of the metal plate 13. It should be noted that the number of the blanking member 17 is not necessarily one. Rather, it is more common to form a plurality of lands 12 at a time using a plurality of blanking members 17 simultaneously.

According to this embodiment, when part of the metal plate 13 is half-blanked with the blanking member 17, that part is not completely blanked, but the blanking member 17 is made to stop pressing at a midway point, thereby making that part of the metal plate 13 half-cut. Accordingly, that part of the metal plate 13 that has been pressed by the blanking member 17 is not separated from the metal plate 13 yet, but remains connected to the body of the metal plate 13. Also, the area of contact between that part of the metal plate 13, where the land 12 should be formed, and the blanking member 17 is smaller than the area of the opening 16 provided for the die 14. Furthermore, in the process step of forming the land 12 to protrude from the metal plate 13 by getting that part of the metal plate 13 pressed by the blanking member 17, the upper surface 12b of the land 12 protruding from the upper surface of the metal plate 13 is greater in area than the bottom 12a of the land 12 formed out of the backside of the metal plate 13. Thus, the edges of the upper surface 12a are curved, because these edges are plastically deformed and rounded.

In this structure, when the land 12 formed in this way is pressed in the direction in which the land 12 protrudes, i.e., when a pressure is applied to the bottom 12a of the land 12, the land 12 is easily separable from the body of the metal plate 13. on the other hand, even when a pressure is applied to the upper surface 12b of the land 12, the land 12 is less likely to be separated from the metal plate 13. In other words, the land 12 is easily separable only by unidirectional pressure.

Also, if the protruding upper part of the land 12 is shaped by a pressing process called "coining", the protruding part of the land 12 can be shaped like a mushroom with a flat upper surface and laterally expanded upper edges. The land 12 is shaped like a mushroom by the coining process. Accordingly, if a semiconductor chip is mounted on the terminal land frame and is molded with a resin encapsulant, then the lands 12 are held by the resin encapsulant more strongly. Since the mushroom-like lands 12 attain anchoring effects in this manner, the chip can be in even tighter contact with the resin encapsulant. Thus, although the resin-molded semiconductor device is of a single-side-molded type, high reliability is attained as a result of the resin molding process.

According to this embodiment, when the lands 12 are formed out of the metal plate 13, the protrusion height of the lands 12 (i.e., a level difference between the upper surface of the lands 12 and that of the metal plate 13) is preferably a half or more of the thickness of the metal plate 13 itself. In this embodiment, the thickness of the metal plate 13 may be 200 $\mu$m, while the protrusion height of the lands 12 may be in the range from 140 $\mu$m to 180 $\mu$m, which is 70 to 90% of the thickness of the metal plate 13 itself. Accordingly, the land 12 protruding from the metal plate 13 is connected to the body of the metal plate 13 via the thinned portion 11 with a very small thickness. In this embodiment, the thickness of the thinned portion 11 may be in the range from 20 $\mu$m to 60 $\mu$m, which is 10 to 30% of the thickness of the metal plate 13 itself. If the thickness of the thinned portion 11 is defined within this range, then the land 12 is easily separable from the metal plate 13 by applying a pressure to the land 12 in the direction in which the land 12 protrudes.

It should be noted that the thickness of the metal plate 13 for the terminal land frame does not have to be 200 $\mu$m, but may be about 400 $\mu$m if necessary. Similarly, although the protrusion height of the lands 12 is supposed to be a half or more of the thickness of the metal plate 13 according to this embodiment, the protrusion height may be less than a half of the thickness of the metal plate 13. At any rate, the protrusion height may be defined at such a value as making the thinned portion 11 easily fracturable upon the application of a pressure after the semiconductor chip and so on have been molded with a resin encapsulant.

Hereinafter, a half-cutting process for forming the lands 12 according to the first embodiment will be described. FIG.

6 is a cross-sectional view illustrating the land 12, metal plate 13 and thinned portion 11 where a half-cut state has been established by the application of a pressure to part of the metal plate 13 using a blanking member.

Figure 6:
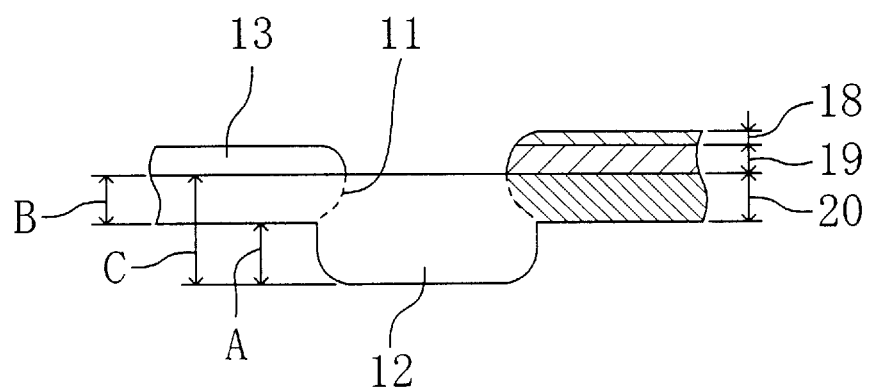
FIG. 6 is a cross-sectional view illustrating land, metal plate and thinned portion where a half-cut state has been established by the application of pressure to part of the metal plate using a blanking member in the half-blanking step according to the present invention.

As shown in FIG. 6, after the land 12 has been formed out of the metal plate 13, the metal plate 13 is divisible into a plastically deformed portion 18, a shear strained portion 19 and a fracturable portion 20. The plastically deformed portion 18 is formed as a result of the half-blanking process using the blanking member 17 shown in FIGS. 4 and 5. The shear strained portion 19 has received shear strain from the blanking member 17. And the fracturable portion 20 includes a fracture plane, which will make the land 12 easily separable upon the application of a pressure to the land 12 in which the land 12 protrudes.

When the lands 12 are formed through the half-blanking process using the blanking members 17, the plastically deformed, shear strained and fracturable portions 18, 19 and 20 are formed in this order. The fracturable portion 20 corresponds to the thinned portion 11. In FIG. 6, the fracturable portion 20 is illustrated as being relatively thick, since this is just a model representation. Actually, however, the fracturable portion 20 is very thin. Also, in the process step of half-cutting the metal plate 13, the size ratio of the portions A and B shown in FIG. 6 is ideally 1:1. That is to say, this is a state where the half-blanking process is finished by making the blanking member 17 stop at a point in time half of the metal plate 13 has been blanked by the blanking member 17. It should be noted that the size ratio A:B is appropriately modifiable depending on the thickness of the metal plate 13.

Furthermore, the thickness ratio of the shear strained portion 19 to the fracturable portion 20 is controllable by changing the size of a clearance created during the half-blanking process. In this specification, the "clearance" is the lateral width of a gap, which is variable with the difference in lateral width between the blanking member 17 and the opening 16 of the die 14. Specifically, if the clearance is reduced, then the shear strained portion 19 can be thicker than the fracturable portion 20. Conversely, if the clearance is increased, then the shear strained portion 19 can be thinner than the fracturable portion 20. Accordingly, if the thickness of the fracturable portion 20 is minimized by eliminating the clearance, the end of the metal plate half-blanking process can be delayed. In such a case, even after the blanking member has reached farther than a halfway point of the metal plate 13, the half-cutting process does not have to be finished.

Also, the cross-sectional area of the blanking member may be larger than that of the opening 16 of the die 14. This is because the half-cut thinned portion can also be formed even in such a case if the blanking member 17 is stopped before the blanking member 17 reaches the upper surface of the die 14.

Figure 7:
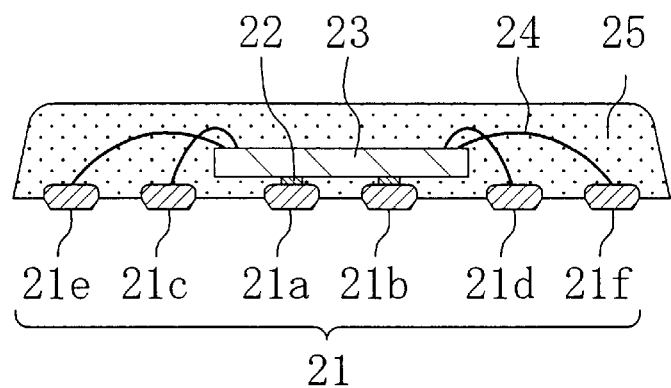
FIG. 7 is a cross-sectional view of the device taken along the line VII—VII shown in FIG. 8.
Figure 8:
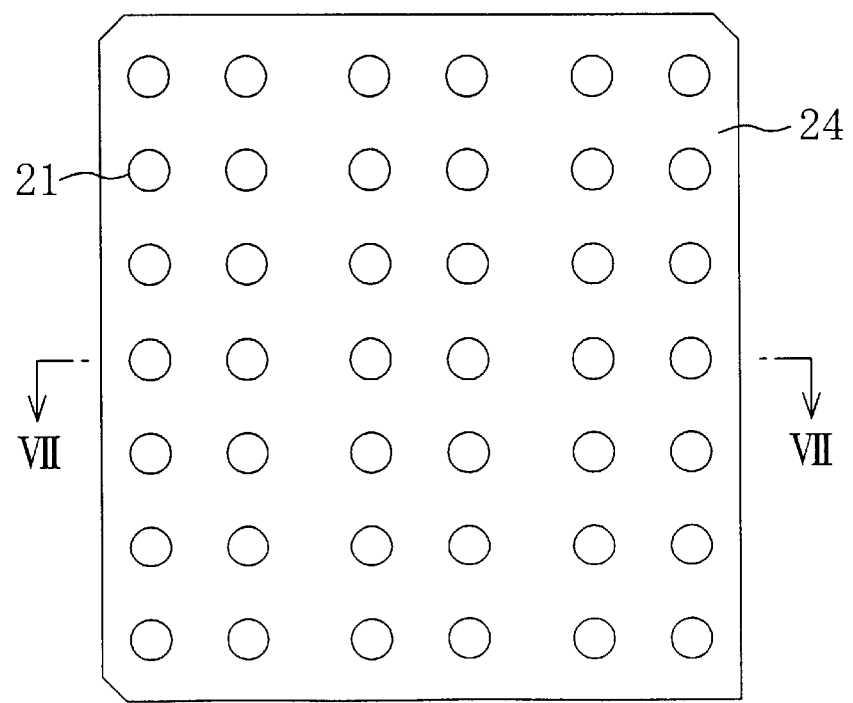
FIG. 8 is a bottom view of a resin-molded semiconductor device according to the first embodiment.

Next, a preferred embodiment of the resin-molded semiconductor device according to the present invention will be described with reference to the accompanying drawings. FIGS. 7 and 8 are cross-sectional view and bottom view, respectively, of the resin-molded semiconductor device according to the first embodiment. FIG. 7 is a cross-sectional view of the device taken along the line VII—VII shown in FIG. 8. The resin-molded semiconductor device according to this embodiment is in a simple rectangular shape as viewed from above. Thus, the illustration of a plan view thereof is omitted herein.

As shown in FIGS. 7 and 8, the resin-molded semiconductor device according to this embodiment includes a semiconductor chip that has been mounted using the terminal land frame. A plurality of lands 21a through 21f shown in FIG. 7 are classified into first and second groups. Specifically, a semiconductor chip 23 is mounted on the lands 21a and 21b of the first group with a conductive adhesive 22 such as silver paste (or insulating paste). On the other hand, the lands 21c, 21d, 21e and 21f of the second group, which are located around the periphery of the semiconductor chip 23, are electrically connected to the semiconductor chip 23 via metal fine wires 24. Also, the lower half of each of these lands 21a through 21f protrudes downward from the lower surface of a resin encapsulant 25. And the semiconductor chip 23, conductive adhesive 22, metal fine wires 24 and respective parts of the lands 21a through 21f are molded with the resin encapsulant 25.

According to this embodiment, the height of the lower part of each land 21 protruding from the lower surface of the resin encapsulant 25 is substantially equal to the thickness B of the fracturable portion 20 shown in FIG. 6, and is obtained by subtracting the protrusion height A of the land 21 from the total thickness C of the terminal land frame. This protrusion height of the lower part of the land 21 corresponds to a standoff height required in mounting the resin-molded semiconductor device on a motherboard.

In the resin-molded semiconductor device according to this embodiment, the lands 21a and 21b of the first group, selected from the lands 21a through 21f, are used as a die pad for supporting the semiconductor chip 23 thereon. The other lands 21c through 21f of the second group are used as external electrodes. On the bottom of the resin-molded semiconductor device, the lands 21 are arranged to form a land grid array. And depending on the size and the number of pins of a semiconductor chip to be mounted, the number of the lands 21 used for supporting the semiconductor chip and the number of the lands 21 used as external electrodes can be appropriately defined.

Also, unlike the resin-molded semiconductor device using a leadframe, the area of the land 21 only needs to be large enough to be wire-bonded (preferably, the diameter thereof should be 100 $\mu$m or more) in the resin-molded semiconductor device according to this embodiment. And the protrusion height (i.e., the standoff height) of the land 21 should be only about 20 $\mu$m to about 60 $\mu$m. Accordingly, electrode pads (not shown) can be arranged at a high density on the upper surface of the semiconductor chip, thus realizing a downsized and thinned resin-molded semiconductor device. Moreover, the structure according to this embodiment can cope with multiple-pin implementation and contribute to the realization of a high-density face-mount resin-molded semiconductor device. Furthermore, even after resin molding has been performed, the resin-molded semiconductor device can be as thin as 1 mm or less, e.g., about 500 $\mu$m.

In addition, in the resin-molded semiconductor device according to this embodiment, the end face of the land 21, which is covered (or molded) with the resin encapsulant, is greater in area than the opposite end face thereof, which is not covered with the resin encapsulant 25 but protrudes. Furthermore, the edge portions of the molded end face of the land 21 are curved (i.e., plastically deformed). Accordingly, in the state shown in FIG. 7, the land 21 is substantially of an inverted trapezoidal cross-sectional shape. By using such a structure, the land 21 can be held by the resin encapsulant 25 more strongly and can be in tighter contact with the resin encapsulant 25. In addition, the assembly can be mounted onto a motherboard with sufficiently high connection reliability maintained. Furthermore, if the thickness of the terminal land frame used is increased, then the contact area between the land 21 and the resin encapsulant 25 can be increased, thus enhancing the anchoring effects. As a result, the reliability can be further improved in such a case.

Next, a preferred embodiment of the method for manufacturing a resin-molded semiconductor device according to the present invention will be described with reference to the accompanying drawings. FIGS. 9(a) through 9(f) are cross-sectional views illustrating respective process steps for manufacturing the resin-molded semiconductor device according to the first embodiment.

Figure 9A:
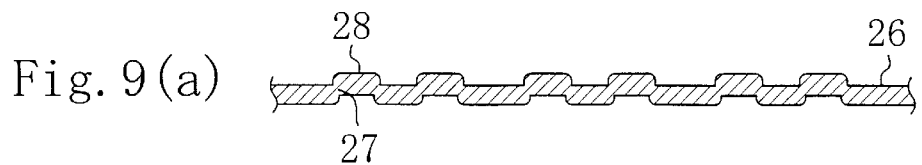
FIGS. 9(a) through 9(f) are cross-sectional views illustrating respective process steps for manufacturing the resin-molded semiconductor device according to the first embodiment.

First, as shown in FIG. 9(a), a terminal land frame 26, which includes a frame body 26 and a plurality of lands 28, is prepared. Each of the lands 28 is formed out of the frame body 26 to be connected to the frame body 26 via a thinned portion 27 and protrude out of the frame body 26. In this case, the terminal land frame is formed such that when the lands 28 are pressed in a direction in which the lands 28 protrude out of the frame body 26, the thinned portions 27 are fractured and the lands 28 are easily separable from the frame body 26.

Figure 9B:
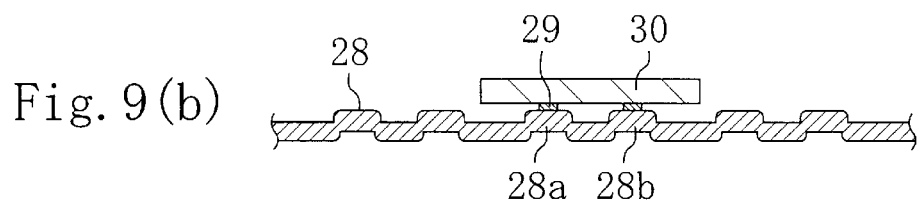

Next, as shown in FIG. 9(b), the terminal land frame is placed with the protruding portions of the lands 28 facing upward. A semiconductor chip 30 is mounted on lands 28a and 28b of the first group among the lands 28 with a conductive adhesive 29 (or insulating paste) introduced therebetween, thereby bonding the semiconductor chip 30 and the lands 28a and 28b of the first group together via the conductive adhesive 29. This process step corresponds to die bonding in an assembling process of a resin-molded semiconductor device. in this process step, the semiconductor chip 30 is bonded to the terminal land frame through a series of steps of applying the conductive adhesive 29 to the terminal land frame, mounting the semiconductor chip 30 and heating.

In this case, the lands 28 are easily separable from the terminal land frame upon the application of a pressure in the direction in which the lands 28 protrude, i.e., a pressure applied upward from under the lower surfaces of the lands 28. However, even when a pressure is applied in the opposite direction, i.e., even if the lands 28 are pressed downward from over the upper surfaces thereof, the lands 28 are less likely to be separated from the terminal land frame. That is to say, these lands 28 are separable only unidirectionally. Accordingly, even when a force pressing the lands 28 downward is applied in mounting the semiconductor chip 30 on the terminal land frame, the lands 28 are not separated from the terminal land frame. Thus, the die bonding process step can be performed safely.

Figure 9C:
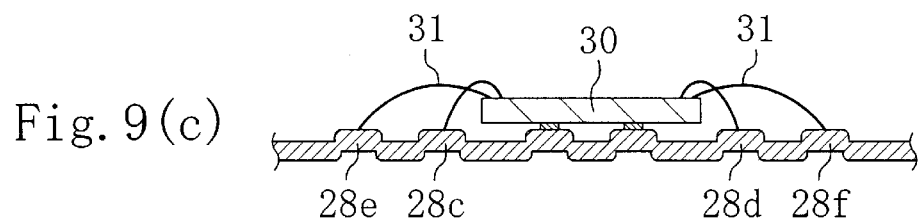

Then, as shown in FIG. 9(c), the semiconductor chip 30 that has been bonded onto the terminal land frame is electrically connected to lands 28c, 28d, 28e and 28f of the second group to be external land electrodes among the lands 28 via metal fine wires 31. This process step is so-called "wire bonding". The area at the upper surface of each of these lands 28, i.e., the area of the surface to which the metal fine wire 31 is connected, is 100 μm φ or more. Accordingly, wire bonding can be performed easily. In this process step, the lands 28 are also easily separable only by pressing them upward. Accordingly, even when a force pressing the lands 28 downward is applied in connecting the metal fine wires 31 to the upper surfaces of the lands 28, the lands 28 are not separated from the terminal land frame. Thus, the wire bonding process step can be performed safely, too.

Figure 9D:
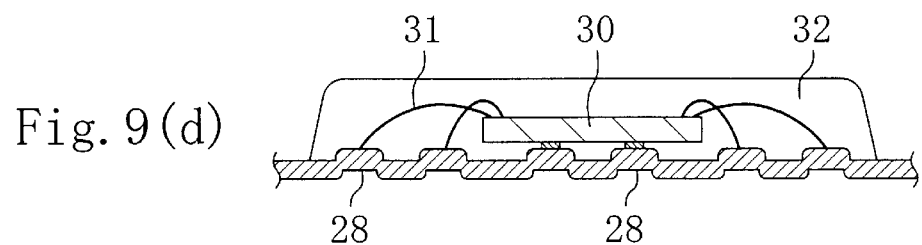

Subsequently, as shown in FIG. 9(d), the semiconductor chip 30, metal fine wires 31 and so on, which have been mounted on the terminal land frame, are molded with a resin encapsulant 32. This process step is ordinarily performed by a single-side-molding technique, i.e., transfer molding using a die assembly consisting of upper and lower dies divided. In this case, only a region over the surface of the terminal land frame, on which the semiconductor chip 30 has been mounted, is covered with the resin encapsulant 32, thereby obtaining a so-called "single-side-molded structure". Since each of the lands 28 protrudes upward out of the body of the terminal land frame, that protruding portion is strongly held by the resin encapsulant 32. Accordingly, although this is a single-side-molded structure, the terminal land frame can be kept in tight contact with the resin encapsulant 32.

Figure 9E:
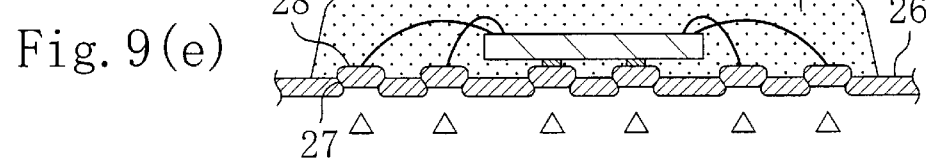

Then, as shown in FIG. 9(e), the terminal land frame is fixed on a fixing member, e.g., the periphery of the terminal land frame is fixed and the region molded with the resin encapsulant 32 is kept freely pressable. In such a state, the bottoms of the lands 28 are pressed upward from under the terminal land frame. For example, a pressure may be applied from under the terminal land frame to the bottoms of the lands 28 by thrusting them up using thrusting pins with the periphery of the terminal land frame fixed. As a result, the thinned portions 27 with a very small thickness, which connect the lands 28 to the frame body 26, are fractured by the pressure resulting from that thrusting, and the lands 28 are separated from the frame body 26 of the terminal land frame. In performing such thrusting, part or all of the lands 28 may be thrust up. Specifically, either only the lands 28 located around the center, i.e., under the semiconductor chip 30, or those located around the periphery may be thrust up. It should be noted that if some of the lands 28 are thrust up, that thrusting should be performed with such a force as not peeling the other lands 28 themselves off the resin encapsulant 32 located at respective positions to which the thrusting force is not applied. The lands 28 may be naturally separated from the frame body 26 of the terminal land frame by any means other than thrusting. For example, the frame body 26 may be twisted or the resin encapsulant 32 may be sucked and pulled up.

Figure 9F:
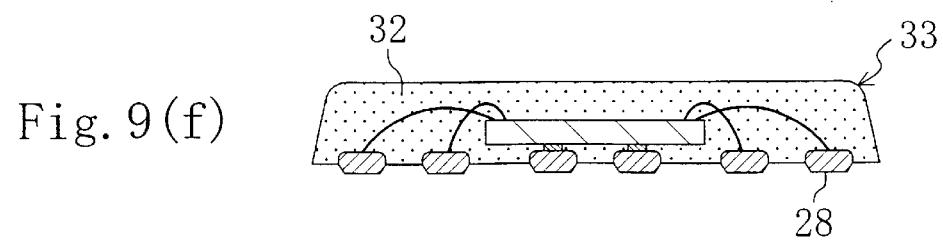

By performing this process step of separating the lands 28 from the frame body 26 of the terminal land frame, the resin-molded semiconductor device 33 shown in FIG. 9(f) is obtained. In this case, the respective portions of the frame body 26, where the lands 28 are not provided, are in loose contact with the resin encapsulant 32. Thus, when the lands 28 are separated from the frame body 26, the resin-molded semiconductor device 33 is easily separable from the frame body 26. Also, as shown in FIG. 9(f), the resin-molded semiconductor device 33 has such a structure that the lands 28 are arranged on the bottom and protrude downward from the bottom of the resin encapsulant 32. Accordingly, the resin-molded semiconductor device 33 is already provided with a standoff height, which is required in mounting the device onto a motherboard. In this case, the standoff height of the resin-molded semiconductor device 33 is substantially equal to the thickness B obtained by subtracting the protrusion height A of the land 28 from the total thickness C of the frame body 26 as shown in FIG. 6. In this manner, a standoff height needed for the lands 28 to function as external land electrodes is ensured. According to this embodiment, the thickness of the frame body 26 may be 200 μm, while the protrusion height of the lands 28 may be in the range from 140 μm to 180 μm, which is 70 to 90% of the thickness of the frame body 26. Thus, the standoff height may be in the range from 20 μm to 60 μm, which is 10 to 30% of the thickness of the frame body 26. In this manner, it is possible to form land electrodes provided with a standoff height needed in mounting the device onto a motherboard.

The resin-molded semiconductor device may be separated from the frame body 26 not only by thrusting the lands 28 up in the above-described manner, but also by removing the frame body 26 itself with the resin-molded semiconductor device fixed. However, in view of the resultant product reliability, the former separation technique is preferred according to this embodiment.

As described above, according to the terminal land frame of this embodiment, only by mounting the semiconductor chip, molding the chip, wires and so on with the resin and then removing the frame body while thrusting the lands upward, land electrodes, which are electrically connected to the semiconductor chip, can be arranged on the bottom of the resin-molded semiconductor device.

As a result, a face-mount semiconductor device is obtained, and the device can be mounted onto a motherboard with more reliability compared to the conventional mounting technique using a leadframe. In addition, in the resin-molded semiconductor device, the standoff height of each land protruding out of the resin encapsulant is obtained by subtracting the height of the land protruding out of the frame body from the thickness of the terminal land frame used. That is to say, the standoff height needed in mounting the device onto the motherboard is ensured when the product is separated from the frame body. Accordingly, no additional process step is required to ensure the standoff height.

Also, unlike a BGA-type semiconductor device, the resin-molded semiconductor device according to this embodiment does not use a substrate provided with land electrodes, but is constructed using a frame body, which is a metal plate called a "terminal land frame". Thus, the resin-molded semiconductor device of this embodiment is more advantageous than the conventional BGA-type semiconductor device in terms of mass-productivity and cost effectiveness. Furthermore, according to this embodiment, a finished product can be easily obtained only by separating the frame body during the finishing process. Accordingly, various process steps of cutting and bending the leads, which are needed in the conventional process of separating the device from the frame, are no longer necessary, thus eliminating the problems of products damaged by the lead cutting and the restriction on cutting accuracy. Therefore, the present invention can provide an innovative, cost-effective technique by cutting down the number of necessary process steps.

Embodiments 2

Figure 10:
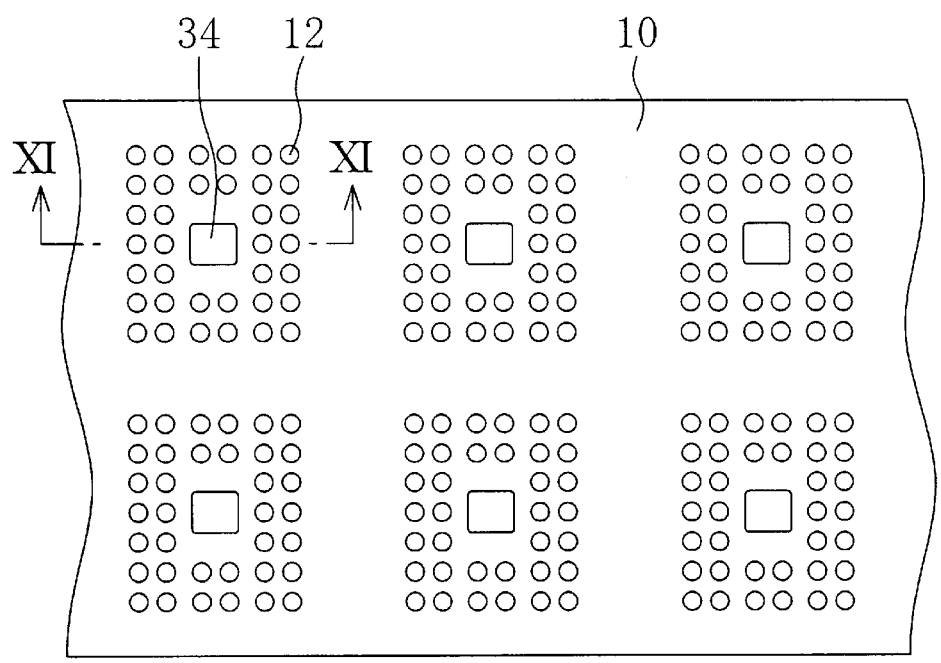
FIG. 10 is a plan view of a terminal land frame according to a second embodiment of the present invention.
Figure 11:
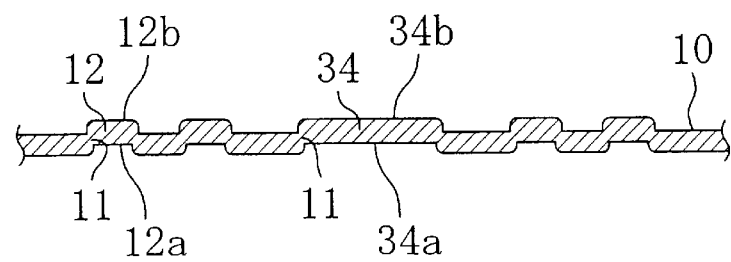
FIG. 11 is a cross-sectional view of the frame taken along the line XI—XI shown in FIG. 10.

FIG. 10 is a plan view of a terminal land frame according to a second embodiment of the present invention. FIG. 11 is a cross-sectional view of the terminal land frame according to the second embodiment taken along the line XI—XI shown in FIG. 10. The basic concept of the terminal land frame according to the second embodiment is the same as that of the terminal land frame according to the first embodiment.

As shown in FIGS. 10 and 11, the terminal land frame according to the second embodiment includes a frame body 10, which is a metal plate made of copper or Alloy 42 that is used widely for leadframes. The terminal land frame further includes: a plurality of lands 12, which are arranged on the frame body 10 to form a matrix pattern, connected to the frame body 10 via thinned portions 11 and protrude upward out of the frame body 10; and a die pad 34. That is to say, the frame body 10, lands 12, thinned portions 11 and die pad 34 are all made of a single metal plate. The terminal land frame is formed in such a manner that when a land 12 is pressed upward on the bottom 12a, the thinned portion 11 is fractured and the land 12 is separable from the frame body 10.

The terminal land frame according to the second embodiment has a similar configuration to that of the terminal land frame shown in FIGS. 1, 2 and 3, but is characterized by further including the die pad 34 for mounting a semiconductor chip thereon.

Accordingly, when the land 12 and die pad 34 are pressed on the bottoms 12a and 34a in such a direction as protruding the land 12 and the die pad 34 upward, the thinned portions 11 as indicated by the broken line are fractured and the land 12 and the die pad 34 are separated from the frame body 10. In this case, the thinned portion 11 is a "linkage portion" formed by half-blanking the frame body 10 itself using a half-cutting member. That is to say, when parts of the frame body 10, in which the lands and die pad are to be formed, are blanked using blanking members, those parts are not blanked through completely, but blanking is stopped preferably at around a midway point. As a result, those half-blanked parts protrude out of the frame body 10 to form the lands 12 and die pad 34. And portions linking these lands 12 and the die pad 34 to the frame body 10 are also formed as the thinned portions 11.

The protrusion height of the lands 12 and die pad 34 as measured from the upper surface of the frame body 10 is a half or more of the thickness of the frame body 10 itself. For example, according to this embodiment, the thickness of the terminal land frame itself, i.e., the thickness of the frame body 10, may be 200 $\mu$m, while the protrusion height of the lands 12 and die pad 34 may be in the range from 140 $\mu$m to 180 $\mu$m, which is 70 to 90% of the thickness of the frame body 10.

Also, according to this embodiment, the terminal land frame is plated with a plurality of metal layers, e.g., nickel (Ni), palladium (Pd) and gold (Au) layers, stacked one upon the other. In this manner, the terminal land frame may be plated if necessary.

The number of the lands 12 may be appropriately defined depending on the number of pins of the semiconductor chip to be mounted. Also, as shown in FIG. 10, the lands 12 may be successively formed out of the frame body 10 both horizontally and vertically alike. Unlike the conventional leadframe, there is no need to separate individual chip mount regions from each other or to provide any tie bars. Furthermore, the lands 12 are illustrated as being circular when viewed from above, but may be polygonal or rectangular. All the lands 12 within the terminal land frame may be of the same size.

Moreover, when a resin-molded semiconductor device is formed with this terminal land frame using the lands 12 as land electrodes, only some of the lands 12 located around the periphery may be larger than the other lands 12 to relax a stress, which is caused when the device is mounted onto a motherboard. The upper surface of the land 12 may be of such a size that a semiconductor chip can be bonded thereto via a metal fine wire like a gold wire. In this embodiment, the size may be 100 $\mu$m$\phi$ or more.

The terminal land frame according to the second embodiment includes none of the conventional members called "inner leads" and "outer leads". Instead, the terminal land frame includes lands 12 functioning as land electrodes, which are arranged to form a matrix or hound's-tooth pattern in its planar layout. Thus, a resin-molded semiconductor device including land electrodes on the bottom can be obtained easily by using this terminal land frame as will be described in detail later. In addition, according to this embodiment, the members functioning as external electrodes of a resin-molded semiconductor device are not radial leads as in a conventional leadframe, but dotted lands 12. Thus, these lands 12 may be disposed at any arbitrary positions in the planar layout. Accordingly, these lands 12 may be placed more freely as external electrodes for a resin-molded semiconductor device, and it is possible to cope with the increase in number of pins of a semiconductor chip.

Next, a method for manufacturing a terminal land frame according to this embodiment will be described. The basic concept of the method for manufacturing a terminal land frame according to the second embodiment is the same as the manufacturing method according to the first embodiment. The second embodiment is different from the first embodiment only in that the die pad 34 is also formed at the same time when the lands 12 are formed.

Specifically, as shown in FIGS. 4 and 5, a metal plate, which has been fixed at a predetermined position on a die, is pressed downward and half-blanked with blanking members. In this manner, parts of the metal plate are protruded into respective openings of the die and portions of the metal plate, with which the blanking members are now in contact, are half-cut, thereby forming the lands and die pad. That is to say, the lands and die pad are formed to remain connected to the metal plate via the thinned portions and to protrude from the body of the metal plate. It should be noted that the number of the blanking member is not necessarily one. Rather, it is more common to form a plurality of lands and die pads at a time using a plurality of blanking members simultaneously.

Also, the area of contact between that part of the metal plate, where the land or die pad should be formed, and the blanking member is smaller than the area of the opening provided for the die. Furthermore, in the process step of forming the land or die pad to protrude out of the metal plate by getting that part of the metal plate pressed by the blanking member, the upper surface of the land or die pad protruding from the upper surface of the metal plate is greater in area than the bottom of the land or die pad formed out of the bottom of the metal plate. Thus, the edges of the upper surface are curved, because these edges are plastically deformed and rounded.

In this structure, when the lands 12 and die pad 34 formed in this way are pressed in the direction in which the lands 12 and die pad 34 protrude, i.e., when a pressure is applied to the respective bottoms 12a and 34a of the lands 12 and die pad 34, the lands 12 and die pad 34 are easily separable from the body of the metal plate. On the other hand, even when a pressure is applied to the respective upper surfaces 12b and 34b of the lands 12 and die pad 34, the lands 12 and die pad 34 are less likely to be separated from the metal plate. In other words, the lands 12 and die pad 34 are easily separable only by unidirectional pressure.

According to this embodiment, when the lands 12 and die pad 34 are formed by half-blanking the metal plate, the protrusion height of the lands 12 and die pad 34 is a half or more of the thickness of the metal plate itself. For example, the thickness of the metal plate may be 200 µm, while the protrusion height of the lands 12 and die pad 34 may be in the range from 140 µm to 180 µm, which is 70 to 90% of the thickness of the metal plate itself. Accordingly, the lands 12 and die pad 34 formed to protrude are connected via the thinned portions with a thickness much smaller than that of the body of the metal plate. In this embodiment, the thickness of the thinned portion 11 may be in the range from 20 µm to 60 µm, which is 10 to 30% of the thickness of the metal plate itself. In such a case, the lands 12 and die pad 34 are easily separable from the metal plate by applying a pressure thereto in the direction in which the lands 12 and die pad 34 protrude.

According to this embodiment, the details of the half-blanking process step, which are omitted in the foregoing description, are similar to those described as for the first embodiment.

Next, a resin-molded semiconductor device using a terminal land frame according to this embodiment will be described with reference to the accompanying drawings.

Figure 12:
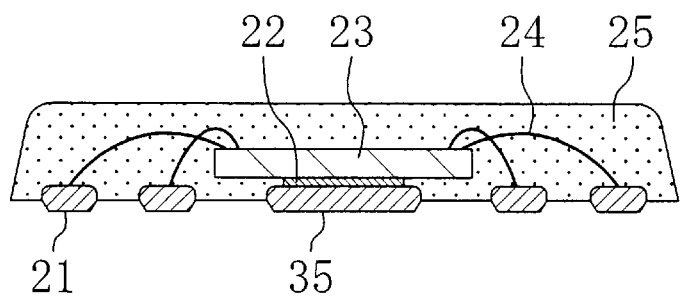
FIG. 12 is a cross-sectional view of the device taken along the line XII—XII shown in FIG. 13.
Figure 13:
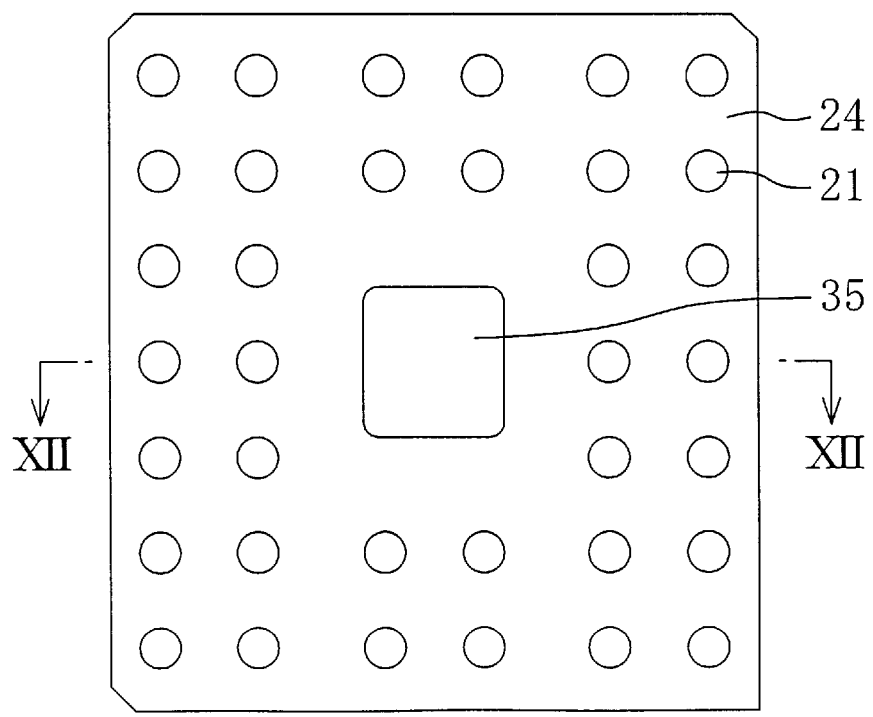
FIG. 13 is a bottom view of a resin-molded semiconductor device according to the second embodiment.

FIGS. 12 and 13 are cross-sectional view and bottom view, respectively, of the resin-molded semiconductor device according to the second embodiment. FIG. 12 is a cross-sectional view of the device taken along the line XII—XII shown in FIG. 13. The resin-molded semiconductor device according to this embodiment is in a simple rectangular shape as viewed from above. Thus, the illustration of a plan view thereof is omitted herein.

As shown in FIGS. 12 and 13, the resin-molded semiconductor device according to this embodiment includes a semiconductor chip that has been mounted using the terminal land frame. Specifically, a semiconductor chip 23 is mounted on the die pad 35 of the terminal land frame shown in FIGS. 10 and 11 via a conductive adhesive 22 such as silver paste. On the other hand, the lands 21, which are located around the periphery of the semiconductor chip 23, are electrically connected to the semiconductor chip 23 via metal fine wires 24. Also, the lower half of each of these lands 21 and that of the die pad 35 protrudes downward out of the lower surface of a resin encapsulant 25. And the semiconductor chip 23, conductive adhesive 22, metal fine wires 24 and respective parts of the die pad 35 and lands 21 are molded with the resin encapsulant 25.

According to this embodiment, the height of the lower part of each land 21 and the die pad 35 protruding out of the lower surface of the resin encapsulant 25 is substantially equal to the thickness B of the fracturable portion 20 as shown in FIG. 6, and is obtained by subtracting the protrusion height A of the land 21 and the die pad 35 from the total thickness C of the terminal land frame. This protrusion height of the lower part of the land 21 and die pad 35 corresponds to a standoff height required in mounting the resin-molded semiconductor device on a motherboard.

According to this embodiment, the semiconductor chip 23 is supported on the die pad 35 and the lands 21 are used as external electrodes. On the bottom of the resin-molded semiconductor device, the lands 21 are arranged to form a land grid array.

In addition, in the resin-molded semiconductor device according to this embodiment, the end face of each land 21 and the die pad 35, which is covered (or molded) with the resin encapsulant 25, is greater in area than the opposite end face thereof, which is not covered with the resin encapsulant 25 but protrudes. Furthermore, the edge portions of the molded end face of each of the lands 21 and die pad 35 are curved (plastically deformed and rounded). Accordingly, in the state shown in FIG. 12, the lands 21 and die pad 35 are substantially of an inverted trapezoidal cross-sectional shape. By using such a structure, the lands 21 and die pad 35 can be held by the resin encapsulant 25 more strongly and can be in tighter contact with the resin encapsulant 25. In addition, the assembly can be mounted onto a motherboard with sufficiently high connection reliability maintained. Furthermore, if the thickness of the terminal land frame used is increased, then the contact area between the lands 21 or die pad 35 and the resin encapsulant 25 can be increased, thus enhancing the anchoring effects. As a result, the reliability can be further improved. Moreover, according to this structure, the semiconductor device can be mounted onto a motherboard on the bottom. Accordingly, compared to the conventional technique of mounting a device onto a motherboard using radial leads, mount reliability can be improved. As a result, reliability, which is equivalent to, or exceeding, that attained by a BGA-type semiconductor device, is attainable.

Next, a preferred embodiment of the method for manufacturing a resin-molded semiconductor device according to the present invention will be described with reference to the accompanying drawings. The basic concept of the method for manufacturing a resin-molded semiconductor device using a terminal land frame according to the second embodiment is the same as that of the method according to the first embodiment. FIGS. 14(a) through 14(f) are cross-sectional views illustrating respective process steps for manufacturing the resin-molded semiconductor device according to the second embodiment.

Figure 14A:
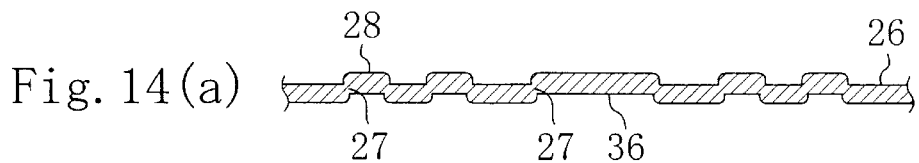
FIGS. 14(a) through 14(f) are cross-sectional views illustrating respective process steps for manufacturing the resin-molded semiconductor device according to the second embodiment.

First, as shown in FIG. 14(a), a terminal land frame, which includes a frame body 26, a plurality of lands 28 and a die pad 36, is prepared. Each of the lands 28 and die pad 36 is formed out of the frame body 26 to be connected to the frame body 26 via a thinned portion 27 and to protrude out of the frame body 26. In this case, the terminal land frame is formed such that when the lands 28 and die pad 36 are pressed in a direction in which the lands 28 and die pad 36 protrude out of the frame body 26, the thinned portions 27 are fractured and the lands 28 and die pad 36 are easily separable from the frame body 26.

Figure 14B:
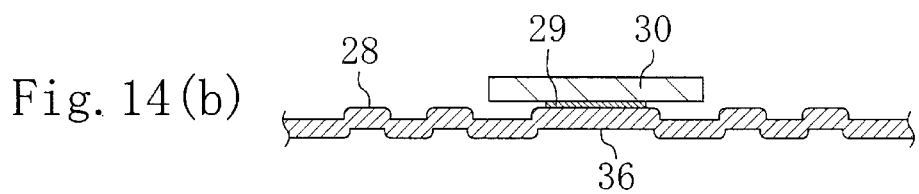

Next, as shown in FIG. 14(b), the terminal land frame is placed with the protruding portions of the lands 28 and die pad 36 facing upward. And a semiconductor chip 30 is mounted on the die pad 36 with a conductive adhesive 29 (or insulating paste) introduced therebetween, thereby bonding the semiconductor chip 30 and the die pad 36 together via the conductive adhesive 29. This process step corresponds to die bonding in an assembling process of a resin-molded semiconductor device. In this process step, the semiconductor chip 30 is bonded to the terminal land frame through a series of steps of applying the conductive adhesive 29 to the terminal land frame, mounting the semiconductor chip 30 and heating.

In this case, the lands 28 and die pad 36 are easily separable from the terminal land frame upon the application of a pressure in the direction in which the lands 28 and die pad 36 protrude, i.e., a pressure applied upward from under the lower surfaces of the lands 28 and die pad 36. However, even when a pressure is applied in the opposite direction, i.e., even if the lands 28 and die pad 36 are pressed downward from over the upper surfaces thereof, the lands 28 and die pad 36 are less likely to be separated from the terminal land frame. That is to say, the lands 28 and die pad 36 are separable only unidirectionally. Accordingly, even when a force pressing the die pad 36 downward is applied in mounting the semiconductor chip 30 on the terminal land frame, the die pad 36 is not separated from the terminal land frame. Thus, the die bonding process step can be performed safely.

Figure 14C:
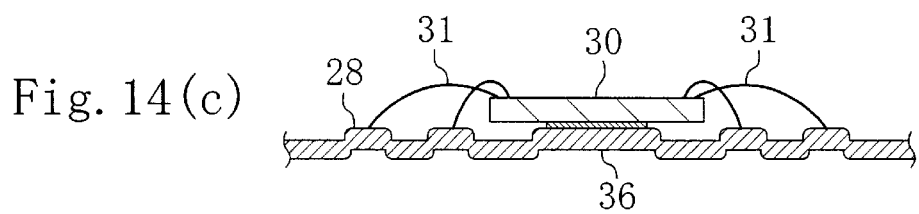

Then, as shown in FIG. 14(c), the semiconductor chip 30 that has been bonded onto the terminal land frame is electrically connected to the lands 28 via metal fine wires 31. This process step is so-called "wire bonding". The area at the upper surface of each of these lands 28, i.e., the area of the surface to which the metal fine wire 31 is connected, is 100 μmϕ or more. Accordingly, wire bonding can be performed easily. In this process step, the lands 28 are also easily separable only by pressing them upward. Thus, even when a force pressing the lands 28 downward is applied in connecting the metal fine wires 31 to the upper surfaces of the lands 28, the lands 28 are not separated from the terminal land frame. Therefore, the wire bonding process step can be performed safely.

Figure 14D:
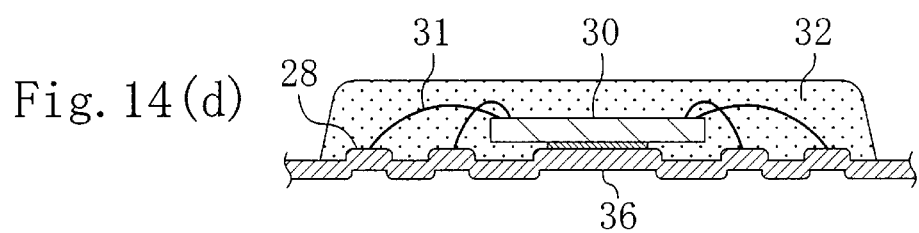

Subsequently, as shown in FIG. 14(d), the semiconductor chip 30, metal fine wires 31 and so on, which have been mounted on the terminal land frame, are molded with a resin encapsulant 32. This process step is ordinarily performed by a single-side-molding technique, i.e., transfer molding using a die assembly consisting of upper and lower dies divided. In this case, only a region over the surface of the terminal land frame, on which the semiconductor chip 30 has been mounted, is covered with the resin encapsulant 32, thereby obtaining a so-called "single-side-molded structure". Since the lands 28 and die pad 36 protrude upward out of the body of the terminal land frame, those protruding portions are strongly held by the resin encapsulant 32. Accordingly, although this is a single-side-molded structure, the terminal land frame can be kept in tight contact with the resin encapsulant 32.

Figure 14E:
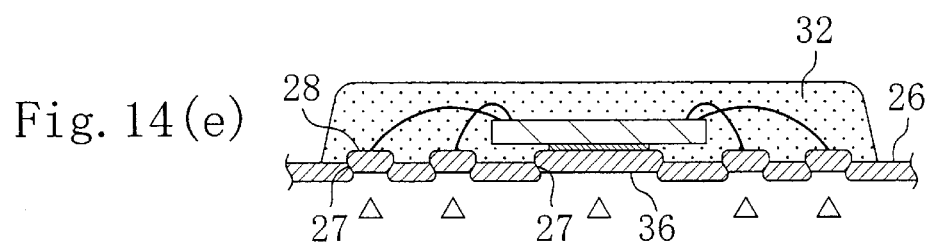

Then, as shown in FIG. 14(e), the terminal land frame is fixed on a fixing member, e.g., the periphery of the terminal land frame is fixed and the region molded with the resin encapsulant 32 is kept freely pressable. In such a state, the lands 28 and die pad 36 are pressed upward on the bottom from under the terminal land frame. For example, a pressure may be applied from under the terminal land frame by thrusting the lands 28 and die pad 36 up via thrusting pins with the periphery of the terminal land frame fixed. As a result, the thinned portions 27 with a very small thickness, which connect the lands 28 and die pad 36 to the frame body 26, are fractured by the pressure resulting from that thrusting, and the lands 28 and die pad 36 are separated from the frame body 26 of the terminal land frame.

Figure 14F:
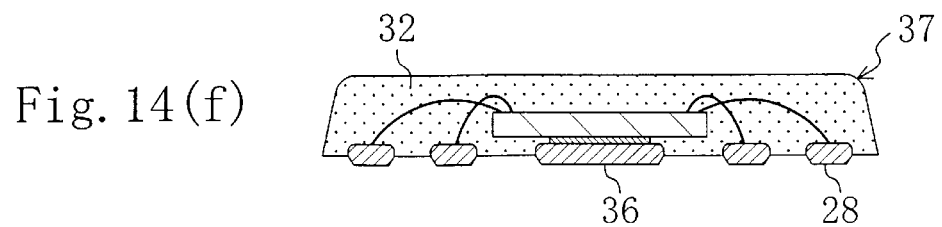

By performing this process step of separating the lands 28 and die pad 36 from the frame body 26 of the terminal land frame, the resin-molded semiconductor device 37 shown in FIG. 14(f) is obtained. As shown in FIG. 14(f), the resin-molded semiconductor device 37 has such a structure that the lands 28 and die pad 36 are arranged on the bottom and protrude downward out of the bottom of the resin encapsulant 32. Accordingly, the resin-molded semiconductor device 37 is already provided with a standoff height, which is required in mounting the device onto a motherboard. In this case, the standoff height of the resin-molded semiconductor device 37 is substantially equal to the thickness B obtained by subtracting the protrusion height A of the lands 28 and die pad 36 from the total thickness C of the frame body 26 as shown in FIG. 6. In this manner, a standoff height needed for the lands 28 to function as external land electrodes is ensured. According to this embodiment, the thickness of the frame body 26 may be 200 μm, while the protrusion height of the lands 28 may be in the range from 140 μm to 180 μm, which is 70 to 90% of the thickness of the frame body 26. Accordingly, the standoff height may be in the range from 20 μm to 60 μm, which is 10 to 30% of the thickness of the frame body 26. In this manner, land electrodes provided with a standoff height needed in mounting the device onto a motherboard are obtained. Also, since the die pad 36 is connected to a radiating electrode of a motherboard, for example, the heat generated inside the semiconductor chip 30 can be dissipated effectively.

By using the terminal land frame according to the second embodiment, the same effects as those attained by the first embodiment are also attainable.

In addition, according to the second embodiment, the die pad is provided separately from the lands unlike the first embodiment. Thus, if the die pad is connected to a radiating electrode of a motherboard, for example, the heat generated inside the semiconductor chip 30 can be dissipated effectively.

Embodiments 3

Figure 16:
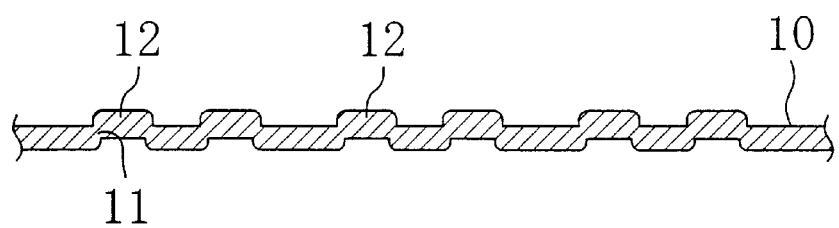
FIG. 16 is a cross-sectional view of the frame taken along the line XVI—XVI shown in FIG. 15.
Figure 17:
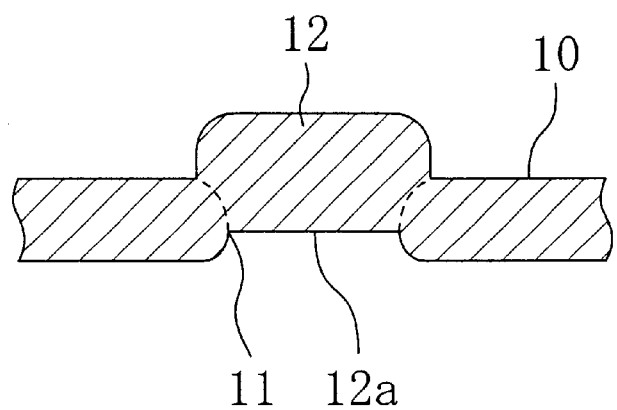
FIG. 17 is a cross-sectional view illustrating a land shown in FIG. 16 to a larger scale.

FIG. 15 is a plan view illustrating a terminal land frame according to a third embodiment of the present invention. FIG. 16 is a cross-sectional view of the frame taken along the line XVI—XVI shown in FIG. 15. FIG. 17 is a cross-sectional view illustrating a land shown in FIG. 16 to a larger scale.

As shown in FIGS. 15 through 17, the terminal land frame according to the third embodiment includes a frame body 10, which is a metal plate made of copper or Alloy 42 that is used widely for leadframes. The terminal land frame further includes a plurality of lands 12, which are arranged on the frame body 10 to form a matrix pattern corresponding to the arrangement of bonding pads of a semiconductor chip, are connected to the frame body 10 via thinned portions 11 and protrude upward out of the frame body 10. That is to say, the frame body 10, lands 12 and thinned portions 11 are all made of a single metal plate. The terminal land frame is formed in such a manner that when a land 12 is pressed upward on the bottom 12a, the thinned portion 11 is fractured and the land 12 is separable from the frame body 10.

Also, as shown in FIG. 15, a large number of lands 12 are arranged to form a matrix pattern in its planar layout. Alternatively, these lands 12 may be arranged to form a hound's-tooth check or checkerboard fashion or may be arranged at random in its planar layout. Anyway, it is possible to adopt any arbitrary arrangement corresponding to that of electrode pads of a semiconductor chip to be mounted thereon.

As shown in FIG. 17, when the land 12 is pressed on the bottom 12a in such a direction as protruding the land 12 upward, the thinned portion 11 as indicated by the broken line is fractured and the land 12 is separated from the frame body 10. In this case, the thinned portion 11 is a "linkage portion" formed by half-blanking the frame body 10 itself using a half-cutting member. That is to say, when part of the frame body 10, in which a land is to be formed, is blanked using a blanking member, that part is not blanked through completely, but blanking is stopped preferably at around a midway point. As a result, that half-blanked part protrudes out of the frame body 10 to form the land 12. And a portion linking the land 12 to the frame body 10 is also formed as the thinned portion 11. Accordingly, the thinned portion 11 is so thin that when the land 12 is pressed on the bottom 12a in such a direction as protruding the land 12 upward, the thinned portion 11 is fractured easily.

The protrusion height of the land 12 as measured from the upper surface of the frame body 10 is a half or more of the thickness of the frame body 10 itself. That is to say, the frame body 10 is formed in such a manner that when a land 12 is pressed on the bottom 12a upward in FIG. 17, the thinned portion 11 is fractured and the land 12 is separable from the frame body 10.

According to this embodiment, the thickness of the terminal land frame itself, i.e., the thickness of the frame body 10, may be 200 $\mu$m, while the protrusion height of the land 12 may be in the range from 140 $\mu$m to 180 $\mu$m, which is 70 to 90% of the thickness of the frame body 10. It should be noted that the thickness of the frame body 10 does not have to be 200 $\mu$m, but may be about 400 $\mu$m if necessary. Also, according to this embodiment, the protrusion height of the land 12 is supposed to be a half or more of the thickness of the frame body, e.g., 70 to 90% of the thickness of the frame body. Alternatively, the protrusion height may be less than a half of the thickness of the frame body. At any rate, the protrusion height may be defined at such a value as making the thinned portion 11 fracturable upon the application of pressure.

Furthermore, in the terminal land frame according to this embodiment, the top of the protruding part of the land 12 is somewhat expanded laterally as a result of a type of pressing called "coining". Accordingly, the upper surface of the land 12 is shaped flat like that of a mushroom. Thus, when a semiconductor chip is mounted on the terminal land frame and molded with a resin, the lands 12 can be held more strongly by the resin encapsulant because the lands 12 are shaped like mushrooms. As a result, the lands 12 can be in tighter contact with the resin encapsulant, thus realizing highly reliable resin molding in spite of the single-side-molded structure thereof. It is noted that the protruding part of the land 12 does not have to have its upper surface flattened like a mushroom, but may be in any arbitrary shape, e.g., like a crook, so long as the resin encapsulant can be anchored by the land 12.

Also, according to this embodiment, the terminal land frame is plated with a plurality of metal layers, e.g., nickel (Ni), palladium (Pd) and gold (Au) layers stacked one upon the other. In this manner, the terminal land frame may be plated if necessary. Plating the terminal land frame may be performed either after or before the metal plate is shaped to form the lands 12. Moreover, the roughness at the surface of the terminal land frame according to this embodiment is equal to or less than 0.1 $\mu$m. Although the surface of the terminal land frame never fails to get rugged by the formation of the lands 12, the surface roughness of the terminal land frame because of other reasons is preferably as small as possible. This is because the roughness affects the ease of peeling the terminal land frame from a resin during resin molding.

The number of the lands 12 may be appropriately defined depending on the number of pins (e.g., the number of electrode pads) of the semiconductor chip to be mounted. Also, as shown in FIG. 15, the lands 12 may be successively formed out of the frame body 10 both horizontally and vertically alike. Furthermore, the land 12 does not have to be circular as viewed from above, but may be polygonal or rectangular. All the lands 12 within the terminal land frame may be of the same size. Moreover, when a resin-molded semiconductor device is formed with this terminal land frame using the lands 12 as land electrodes, only some of the lands 12 located around the periphery may be larger than the other lands 12 to relax a stress caused when the device is mounted onto a motherboard. The upper surface of the land 12 may be of such a size that a semiconductor chip can be bonded thereto via a metal fine wire like a gold wire. In this embodiment, the size may be 100 $\mu$m$\phi$ or more.

The terminal land frame according to this embodiment includes none of the conventional members called "inner leads", "outer leads" and "die pad". Instead, the terminal land frame includes lands 12 functioning as land electrodes, which are arranged to form a matrix or hound's-tooth pattern in its planar layout. Thus, a resin-molded semiconductor device including land electrodes on the bottom can be obtained easily by using this terminal land frame as will be described in detail later. In addition, according to this embodiment, the members functioning as external electrodes of a resin-molded semiconductor device are not radial leads as in a conventional leadframe, but dotted lands 12. Thus, these lands 12 may be disposed at any arbitrary positions in the planar layout. Accordingly, these lands 12 may be placed more freely as the external electrodes of a resin-molded semiconductor device, and it is possible to cope with the increase in number of pins of a semiconductor chip. The arrangement pattern of the lands 12 is arbitrarily selectable in accordance with the number of pins of a semiconductor chip to be mounted. Thus, it is naturally possible to arrange the lands 12 in line as in the conventional leadframe.

The terminal land frame according to the third embodiment is characterized in that the arrangement of the lands 12 is in accord with that of electrode pads of a semiconductor chip to be mounted unlike the first embodiment.

Figure 18:
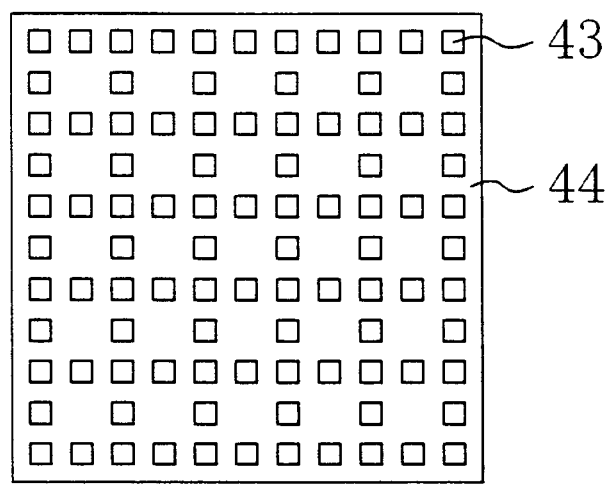
FIG. 18 is a plan view of a semiconductor chip used in the third embodiment.

FIG. 18 is a plan view of a semiconductor chip 44 used in the third embodiment. As shown in FIG. 18, electrode pads 43 like area pads are provided on the upper surface of the semiconductor chip 44. The terminal land frame with the arrangement of lands 12 as shown in FIG. 15 is applicable to the semiconductor chip 44 with the arrangement of electrode pads 43 like area pads as shown in FIG. 18.

Figure 19:
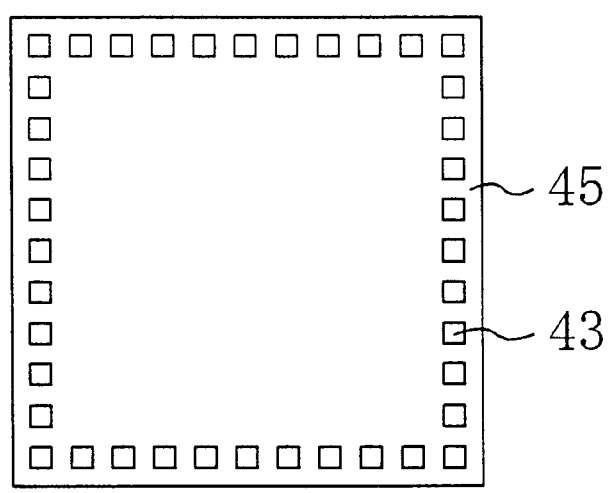
FIG. 19 is a plan view of a semiconductor chip used in a modified example of the third embodiment.

FIG. 19 is a plan view of a semiconductor chip 45 used in a modified example of the third embodiment. As shown in FIG. 19, electrode pads 43 are arranged around the periphery of the upper surface of the semiconductor chip 45.

Figure 20:
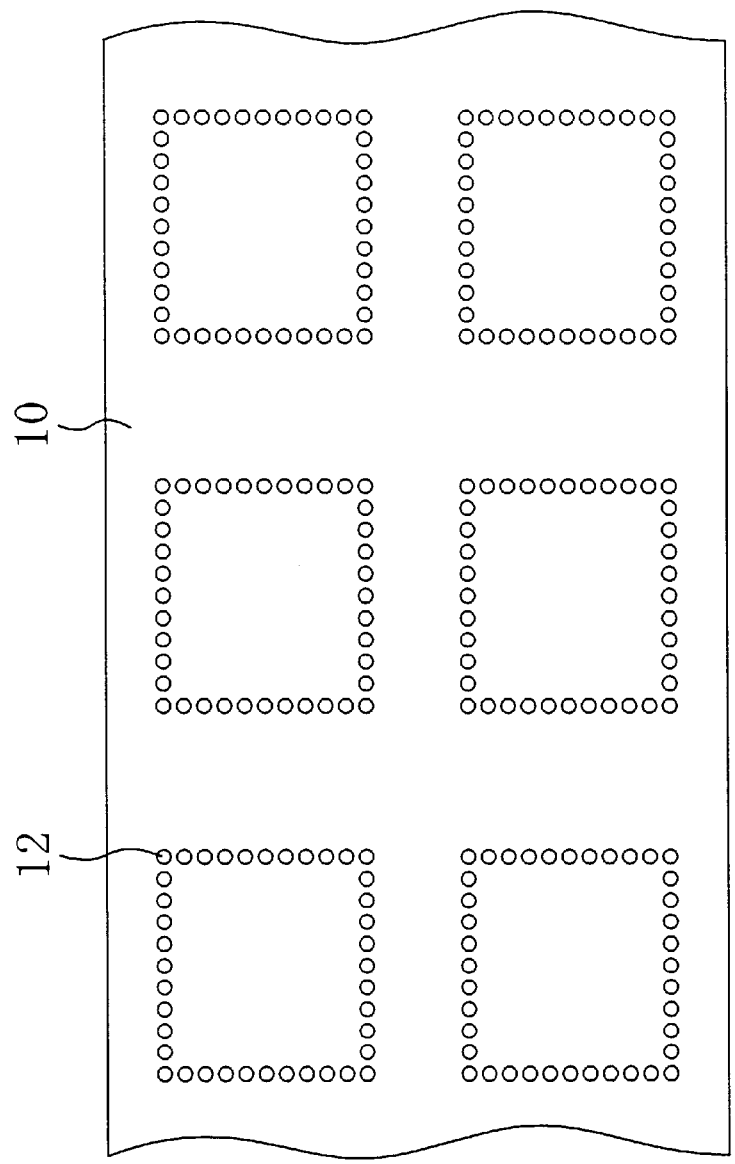
FIG. 20 is a plan view of a terminal land frame applicable to a semiconductor chip with electrode pads arranged around the periphery thereof such as that shown in FIG. 19.

FIG. 20 is a plan view of a terminal land frame applicable to the semiconductor chip 45 with the electrode pads 43 arranged around the periphery thereof such as that shown in FIG. 19. That is to say, in the terminal land frame according to this modified example, the lands 12 are arranged in line on each side of a square on the frame body 10 so as to correspond to the arrangement of electrode pads 43 around the periphery.

In the following description of the third embodiment, it is supposed that the semiconductor chip 44 shown in FIG. 18 is used for the terminal land frame shown in FIG. 15 as a typical example.

Next, a method for manufacturing the terminal land frame according to the third embodiment will be described.

According to the third embodiment, the lands 12 are formed by performing the half-blanking process step during the manufacturing process of the terminal land frame in exactly the same way as described in the first embodiment with reference to FIGS. 4 through 6. In addition, the thicknesses of respective portions are also just as already described. Thus, the illustration and description of the half-blanking process step will be omitted herein.

Next, a resin-molded semiconductor device according to the third embodiment will be described with reference to the accompanying drawings.

Figure 21:
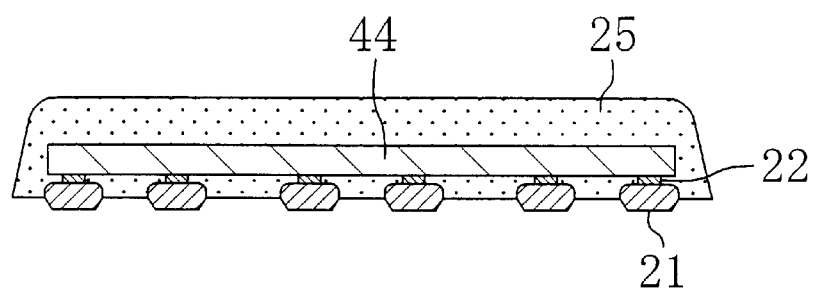
FIG. 21 is a cross-sectional view of the device taken along the line XXI—XXI shown in FIG. 22.
Figure 22:
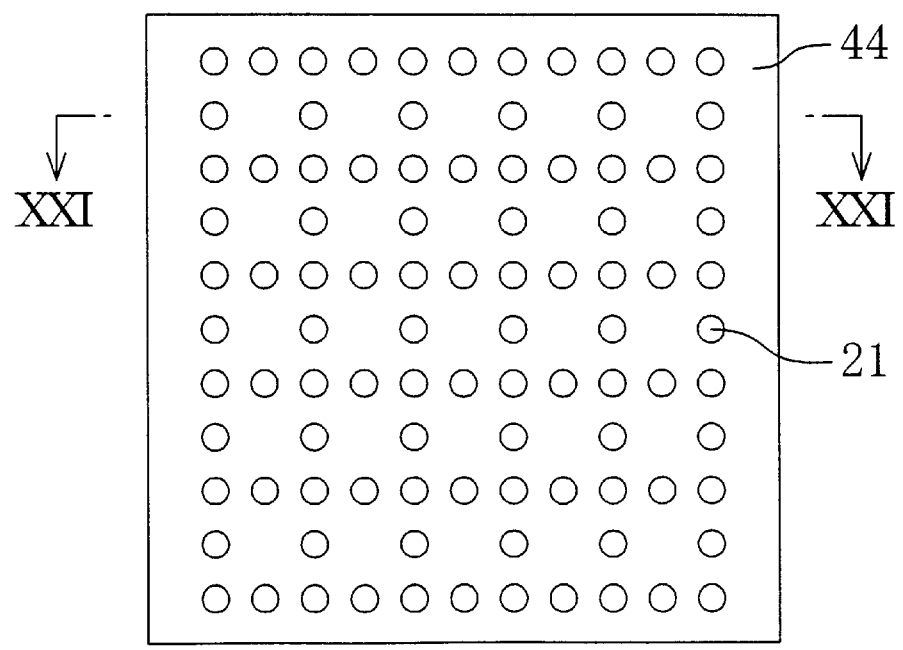
FIG. 22 is a bottom view of a resin-molded semiconductor device according to the third embodiment.

FIGS. 21 and 22 are respectively cross-sectional view and bottom view of a resin-molded semiconductor device according to the third embodiment. FIG. 21 is a cross-sectional view of the device taken along the line XXI—XXI shown in FIG. 22. The resin-molded semiconductor device according to this embodiment is in a simple rectangular shape as viewed from above. Thus, the illustration of a plan view thereof is omitted herein.

As shown in FIGS. 21 and 22, the resin-molded semiconductor device according to this embodiment includes a semiconductor chip that has been mounted using the terminal land frame. Specifically, a semiconductor chip 44 is mounted on the lands 21 via a conductive adhesive 22 such as silver paste (or insulating paste) as shown in FIG. 21. Also, the lower half of each of these lands 21 protrudes downward from the lower surface of a resin encapsulant 25. And the semiconductor chip 44, conductive adhesive 22 and respective parts of the lands 21 are molded with the resin encapsulant 25.

According to this embodiment, the height of the lower part of each land 21 protruding out of the lower surface of the resin encapsulant 25 is substantially equal to the thickness B of the fracturable portion 20 shown in FIG. 6, and is obtained by subtracting the protrusion height A of the land 21 from the total thickness C of the terminal land frame. This protrusion height of the lower part of the land 21 corresponds to a standoff height required in mounting the resin-molded semiconductor device on a motherboard.

In the resin-molded semiconductor device according to this embodiment, the semiconductor chip 44 is mounted facedown on the lands 21, thereby electrically connecting the electrode pads of the semiconductor chip 44 to the lands 21. That is to say, according to the third embodiment, no metal fine wires are used unlike the first and second embodiments.

On the bottom of the resin-molded semiconductor device, the lands 21 are arranged to form a land grid array. The area of the resin-molded semiconductor device is substantially equal to that of the semiconductor chip 44. In other words, the size of this package is approximately equal to that of the chip. Also, unlike the conventional resin-molded semiconductor device using a leadframe, the upper surface area of the land 21 only needs to be as large as that of the electrode pad 43 of the semiconductor chip 44, i.e., about 100 $\mu$m$\phi$. In addition, the height of the land 21 may be about 140 $\mu$m to about 180 $\mu$m. Accordingly, the electrode pads 43 can be arranged at a high density, thus realizing a downsized and thinned resin-molded semiconductor device. Moreover, the structure according to this embodiment can cope with multiple-pin implementation and contribute to the realization of a high-density face-mount resin-molded semiconductor device. Furthermore, even after resin molding has been performed, the resin-molded semiconductor device can be as thin as 1 mm or less, e.g., about 500 $\mu$m.

In addition, in the resin-molded semiconductor device according to this embodiment, the end face of the land 21, which is covered (or molded) with the resin encapsulant 25, is greater in area than the opposite end face thereof, which is not covered with the resin encapsulant 25 but protrudes. Furthermore, the edge portions of the molded end face of the land 21 are curved (or plastically deformed and rounded). Accordingly, in the state shown in FIG. 21, the land 21 is substantially of an inverted trapezoidal cross-sectional shape. By using such a structure, the land 21 can be held by the resin encapsulant 25 more strongly and can be in tighter contact with the resin encapsulant 25. In addition, the assembly can be mounted onto a motherboard with sufficiently high connection reliability maintained. Furthermore, if the thickness of the terminal land frame used is increased, then the contact area between the land 21 and the resin encapsulant 25 can be increased, thus enhancing the anchoring effects. As a result, the reliability can be further improved.

According to this embodiment, the semiconductor chip 44 is entirely molded within the resin encapsulant 25. Alternatively, the backside of the semiconductor chip 44 may be exposed by injecting the resin encapsulant only into the gap between the semiconductor chip 44 and the lands 21 and molding them. Also, the semiconductor chip 44 is connected to the lands 21 via the conductive adhesive 22. As an alternative, protruding electrodes such as Au bump electrodes, preferably two-step protruding electrodes, may be formed in advance on the electrode pads 43 of the semiconductor chip 44 and a conductive adhesive may be applied to these protruding electrodes to electrically connect the electrode pads 43 and the lands 21 together. In such a case, since the protruding electrodes have a stepped structure, the conductive adhesive can be held by the protruding electrodes more strongly, and the conductive adhesive does not stick out between the electrode pad and the land, thus improving the connection reliability.

Next, a method for manufacturing a resin-molded semiconductor device according to the third embodiment will be described with reference to the accompanying drawings. FIGS. 23(a) through 23(e) are cross-sectional views illustrating respective process steps for manufacturing the resin-molded semiconductor device according to the third embodiment.

Figure 23A:
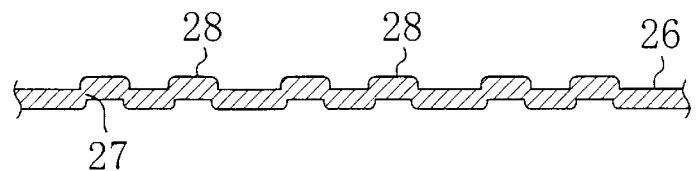
FIGS. 23(a) through 23(e) are cross-sectional views illustrating respective process steps for manufacturing the resin-molded semiconductor device according to the third embodiment.

First, as shown in FIG. 23(a), a terminal land frame, which includes a frame body 26 and a plurality of lands 28, is prepared. Each of the lands 28 is formed out of the frame body 26 to be connected to the frame body 26 via a thinned portion 27 and to protrude out of the frame body 26. In this case, the terminal land frame is formed such that when the lands 28 are pressed in a direction in which the lands 28 protrude out of the frame body 26, the thinned portions 27 are fractured and the lands 28 are easily separable from the frame body 26.

Figure 23B:
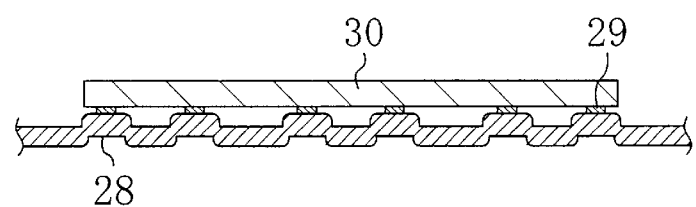

Next, as shown in FIG. 23(b), the terminal land frame is placed with the protruding portions of the lands 28 facing upward, and the semiconductor chip 30 is disposed face-down over the terminal land frame with the side, on which the electrode pads (not shown) are formed, facing downward. And the semiconductor chip 30 is mounted on the lands 28 with a conductive adhesive 29 introduced therebetween, thereby bonding the respective electrode pads of the semiconductor chip 30 to the associated lands 28 via the conductive adhesive 29. This process step corresponds to flip-chip bonding in an assembling process of a semiconductor device. In this process step, the semiconductor chip 30 is bonded to the terminal land frame through a series of steps of applying the conductive adhesive 29 to the terminal land frame, mounting the semiconductor chip 30 facedown and heating.

In this case, the lands 28 are easily separable from the terminal land frame upon the application of a pressure in the direction in which the lands 28 protrude, i.e., a pressure applied from under the lower surfaces of the lands 28. However, even when a pressure is applied in the opposite direction, i.e., even if the lands 28 are pressed from over the upper surfaces thereof, the lands 28 are less likely to be separated from the terminal land frame. That is to say, these lands 28 are separable only unidirectionally. Accordingly, even when a force pressing the lands 28 downward is applied in mounting the semiconductor chip 30 on the terminal land frame, the lands 28 are not separated from the terminal land frame. Thus, flip-chip bonding can be performed safely.

Figure 23C:
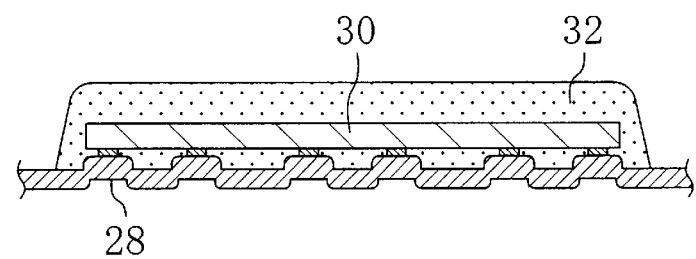

Then, as shown in FIG. 23(c), the semiconductor chip 30, which has been bonded facedown on the terminal land frame, and the bonding portions are molded with a resin encapsulant 32. This process step is ordinarily performed by a single-side-molding technique, i.e., transfer molding using a die assembly consisting of upper and lower dies divided. In this case, only a region over the surface of the terminal land frame, on which the semiconductor chip 30 has been mounted, is covered with the resin encapsulant 32, thereby obtaining a so-called "single-side-molded structure". Since each of the lands 28 protrudes upward out of the body of the terminal land frame, that protruding portion is strongly held by the resin encapsulant 32. Accordingly, although this is a single-side-molded structure, the terminal land frame can be kept in tight contact with the resin encapsulant 32.

In this case, the assembly may be molded with the resin 32 only partially by injecting the resin encapsulant 32 into the gap between the semiconductor chip 30 and the lands 28 of the terminal land frame using a nozzle, syringe or the like. In the semiconductor device formed in this way, the backside of the semiconductor chip 30 is not covered with the resin encapsulant 32 but exposed to the air. As a result, a package with excellent radiative properties can be obtained.

Figure 23D:
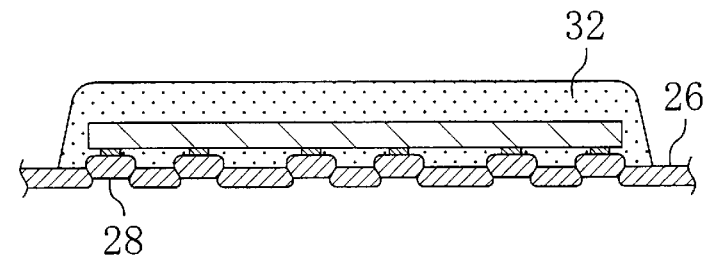

Then, as shown in FIG. 23(d), the terminal land frame is fixed on a fixing member, e.g., the periphery of the terminal land frame is fixed and the region molded with the resin encapsulant 32 is kept freely pressable. In such a state, the lands 28 are pressed upward on the bottom from under the terminal land frame. For example, a pressure may be applied from under the terminal land frame by thrusting the lands 28 up using thrusting pins with the periphery of the terminal land frame fixed. As a result, the thinned portions 27 with a very small thickness, which connect the lands 28 to the frame body 26, are fractured by the pressure resulting from that thrusting, and the lands 28 are separated from the frame body 26 of the terminal land frame. In performing such thrusting, part or all of the lands 28 may be thrust up. Specifically, either only the lands 28 located around the center, i.e., under the semiconductor chip 30 or those located around the periphery may be thrust up. It should be noted that if some of the lands 28 are thrust up, that thrusting should be performed with such a force as not peeling the lands 28 themselves off the resin encapsulant 32 located at respective positions to which the thrusting force is not applied. The lands 28 may be naturally separated from the frame body 26 of the terminal land frame by any means other than thrusting. For example, the frame body 26 may be twisted or the resin encapsulant 32 may be sucked and pulled up.

Figure 23E:
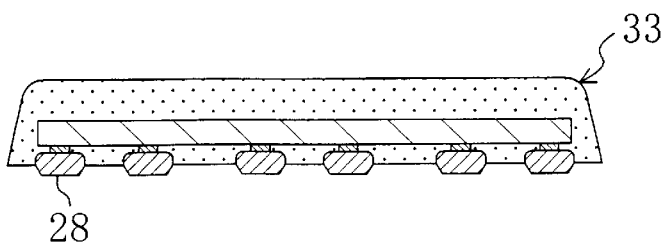
Figure 24:
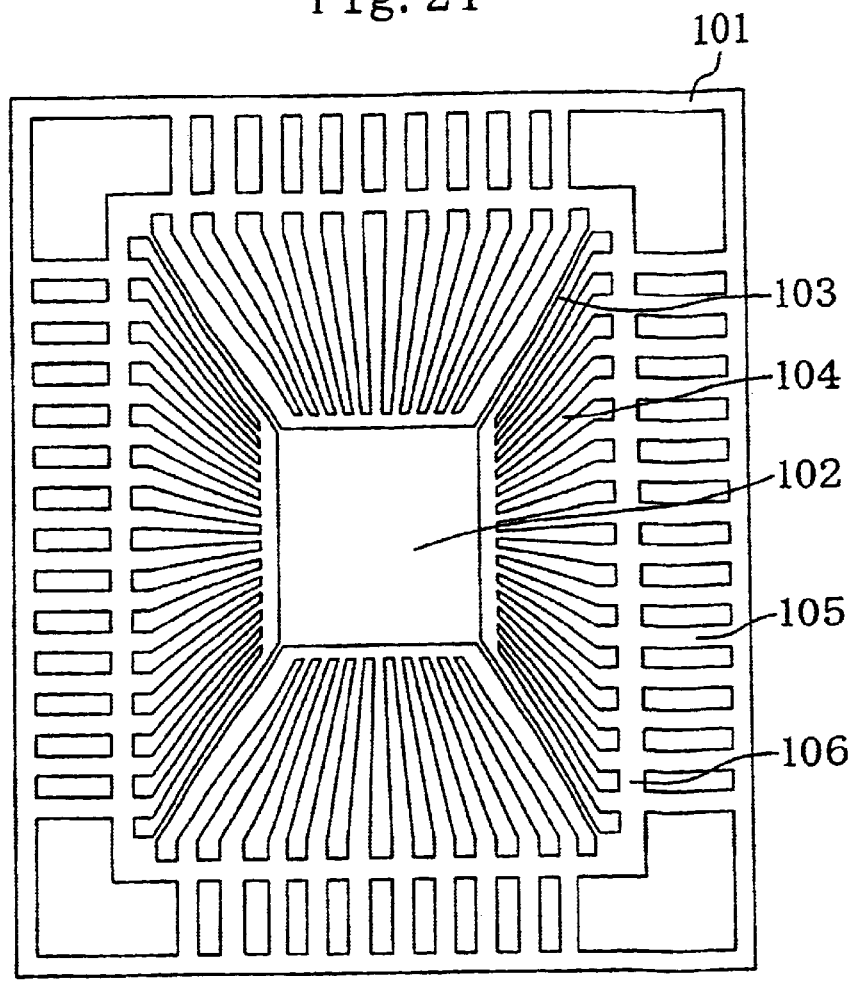
FIG. 24 is a plan view of a conventional leadframe.
Figure 25:
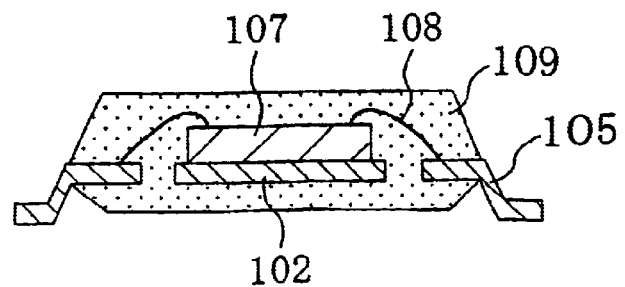
FIG. 25 is a cross-sectional view of a conventional resin-molded semiconductor device.
Figure 26:
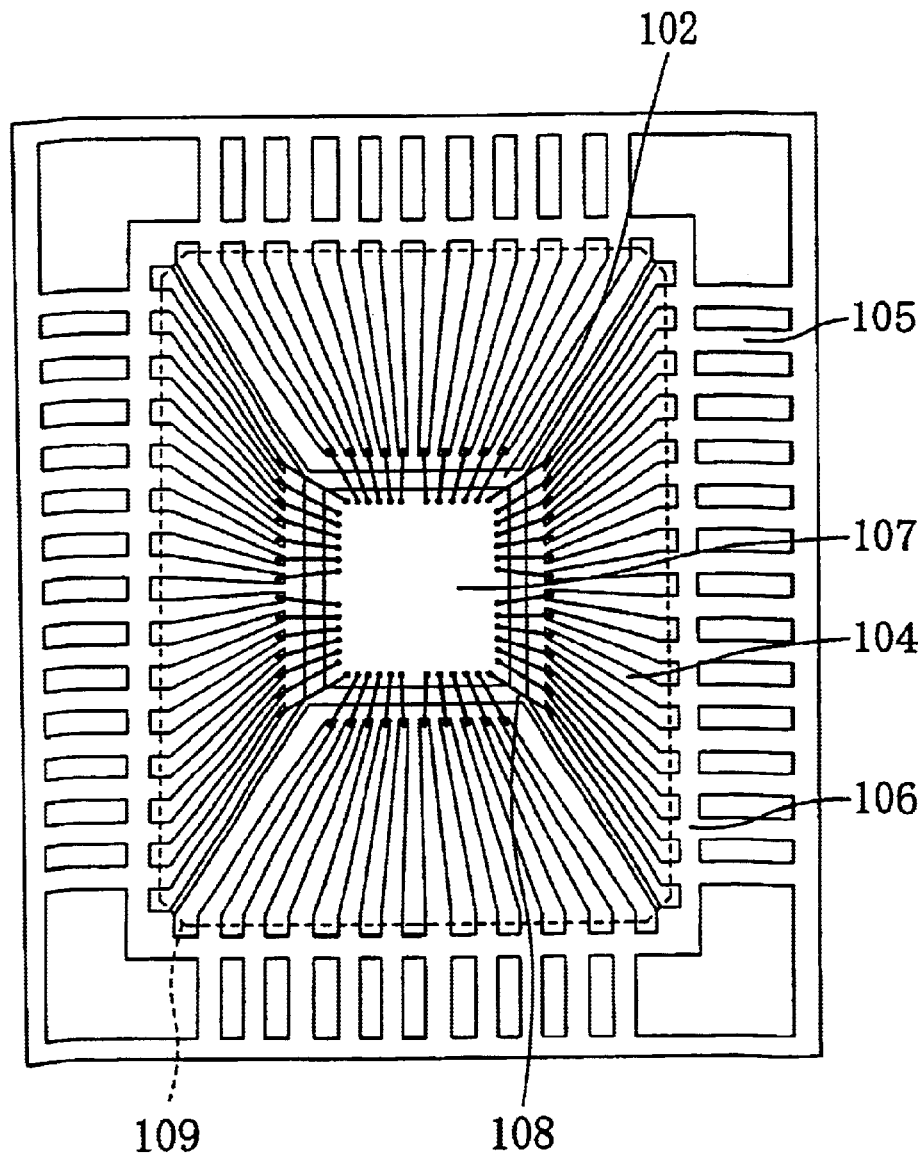
FIG. 26 is a plan view illustrating a method for manufacturing the conventional resin-molded semiconductor device.

By performing this process step of separating the lands 28 from the frame body 26 of the terminal land frame, the resin-molded semiconductor device 33 shown in FIG. 23(e) is obtained. In this case, the respective portions of the frame body 26, where the lands 28 are not provided, are in loose contact with the resin encapsulant 32. Thus, when the lands 28 are separated from the frame body 26, the resin-molded semiconductor device 33 is easily separable from the frame body 26. Also, as shown in FIG. 23(e), the resin-molded semiconductor device 33 has such a structure that the lands 28 are arranged on the bottom and protrude downward from the bottom of the resin encapsulant 32. Accordingly, the resin-molded semiconductor device 33 is already provided with a standoff height, which is required in mounting the device onto a motherboard. In this case, the standoff height of the resin-molded semiconductor device 33 is substantially equal to the thickness B obtained by subtracting the protrusion height A of the land 28 from the total thickness C of the frame body 26 as shown in FIG. 6. In this manner, a standoff height needed for the lands 28 to function as external land electrodes is ensured. According to this embodiment, the thickness of the frame body 26 may be 200 $\mu$m, while the protrusion height of the lands 28 may be in the range from 140 $\mu$m to 180 $\mu$m, which is 70 to 90% of the thickness of the frame body 26. Accordingly, the standoff height may be in the range from 20 µm to 60 µm, which is 10 to 30% of the thickness of the frame body 26. In this manner, land electrodes provided with a standoff height needed in mounting the device onto a motherboard are obtained.

As described above, according to the terminal land frame of this embodiment, only by flip-chip mounting the semiconductor chip, molding the chip and so on with the resin and then removing the terminal land frame while thrusting the lands upward, land electrodes, which are electrically connected to the semiconductor chip, can be arranged on the bottom of the resin-molded semiconductor device.

As a result, a face-mount semiconductor device is obtained, and the device can be mounted onto a motherboard with more reliability compared to the conventional mounting technique using a leadframe. In addition, in the resin-molded semiconductor device, the standoff height of each land protruding out of the resin encapsulant is obtained by subtracting the height of the land protruding out of the frame body from the thickness of the terminal land frame used. Since the standoff height needed in mounting the device onto the motherboard is ensured when the product is separated from the frame body, no additional process step is required to ensure the standoff height.

Also, unlike a BGA-type semiconductor device, the resin-molded semiconductor device according to this embodiment does not use a substrate provided with land electrodes, but is constructed using a frame body made of a metal plate called a "terminal land frame". Thus, the resin-molded semiconductor device of this embodiment is more advantageous than the conventional BGA-type semiconductor device in terms of mass-productivity and cost effectiveness. Furthermore, according to this embodiment, a finished product can be easily obtained only by separating the frame body. Accordingly, various process steps of cutting and bending the leads, which are needed in the conventional technique of separating the device from the frame, are no longer necessary, thus eliminating the problems of products damaged by the lead cutting and the restriction on cutting accuracy. Therefore, the present invention can provide an innovative, cost-effective technique by cutting down the number of necessary process steps.

Furthermore, the lands are separated from the frame body by applying a pressure such as thrusting force thereto in the foregoing description. However, the lands may also be separated from the frame body at the thinned portions by any technique other than thrusting, e.g., the frame body may be peeled off with the resin-molded semiconductor device fixed. Accordingly, any of various means for effectively cutting the thinned portions, which connect the lands to the frame body, may be adopted.

What is claimed is:

1. A terminal land frame comprising:

a frame body;

a plurality of lands, each one of said plurality of lands being substantially as thick as the frame body, at least part of each one of said plurality of lands having a projection protruding out of the frame body and a recess part depressing inwardly from the frame body formed by pressing on the opposite side of the projection; and a plurality of thinned portions, each one of said plurality of thinned portions having a thickness of 10% to 30% of the thickness of the frame body and connecting the frame body to associated one of the lands, wherein the frame body, the lands and the thinned portions are all made of a single metal plate, and wherein when each one of said plurality of lands is pressed in a direction in which the land protrudes, associated one of the thinned portions is fractured and the land is separable from the frame body.

2. The terminal land frame of claim 1, wherein the top of the part of each said land, which protrudes from the frame body, is laterally expanded and shaped like a mushroom.

3. The terminal land frame of claim 1, wherein the top face of the part of each said land, which protrudes from the frame body, is greater in area than another face of the land.

4. A terminal land frame comprising:

a frame body;

a die pad being substantially as thick as the frame body and including a projection protruding out of the frame body and a first recess part depressing inwardly from the frame body formed by pressing on the opposite side of the projection;

a plurality of lands, each one of said plurality of lands being substantially as thick as the frame body and including a projection protruding out of the frame body and a second recess part depressing inwardly from the frame body formed by pressing on the opposite side of the projection;

a first thinned portion, which has a thickness of 10% to 30% of the thickness of the frame body, connecting the frame body and the die pad together; and a plurality of second thinned portions, each one of said plurality of second thinned portions having a thickness of 10% to 30% of the thickness of the frame body and connecting the frame body to associated one of the lands, wherein the frame body, the die pad, the lands and the first and second thinned portions are all made of a single metal plate, and wherein when the die pad and each one of said plurality of lands are pressed in a direction in which the die pad and the land protrude, the first thinned portion and associated one of the second thinned portions are fractured and the die pad and the land are separable from the frame body.

5. The terminal land frame of claim 4, wherein the top of the first part of the die pad and the top of the second part of each of said land are laterally expanded and shaped like a mushroom.

6. The terminal land frame of claim 4, wherein the top face of the first part of the die pad is greater in area than another face of the first part of the die pad, which is opposite to the top face, and the top face of the first part has curved edges, and wherein the top face of the second part of each said land is greater in area than another face of the second part, which is opposite to the top face, and the top face of the second part has curved edges.

7. A resin-molded semiconductor device formed by using a terminal land frame, the terminal land frame including:

a metallic frame body;

a plurality of lands including first and second groups of lands, each one of said plurality of lands being substantially as thick as the frame body, at least part of each one of said plurality of lands having a projection protruding out of the frame body and a recess part depressing inwardly from the frame body formed by pressing on the opposite side of the projection; and a plurality of thinned portions, each one of said plurality of thinned portions having a thickness of 10% to 30% of the thickness of the frame body and connecting the frame body to associated one of the lands, the frame body, the lands and the thinned portions are all made of a single metal plate, the semiconductor device comprising:
 a semiconductor chip being mounted on the first group of lands and having a plurality of electrode pads;
 a plurality of connection members, each one of said plurality of connection members electrically connecting each one of said plurality of lands of the second group to associated one of the electrode pads; and
 a resin encapsulant for molding the semiconductor chip, the connection members and respective upper halves of the lands, each said upper half corresponding to the part of the associated land that protrudes out of the frame body,
 wherein a lower half of each one of said plurality of lands other than the upper half thereof is not covered with the resin encapsulant but protrudes downward out of the lower surface of the resin encapsulant.

8. The device of claim 7, wherein the top face of the upper half of each said land, which is buried in the resin encapsulant, is greater in area than the bottom face of the lower half thereof, and the top face of the upper half has curved edges.

9. A resin-molded semiconductor device formed by using a terminal land frame, the terminal land frame including:
 a metallic frame body;
 a die pad being substantially as thick as the frame body and including a first part protruding out of the frame body;
 a plurality of lands, each one of said plurality of lands being substantially as thick as the frame body and including a second part protruding out of the frame body;
 a first thinned portion, which has a thickness of 10% to 30% of the thickness of the frame body, connecting the frame body and the die pad together; and
 a plurality of second thinned portions, each one of said plurality of second thinned portions having a thickness of 10% to 30% of the thickness of the frame body and connecting the frame body to associated one of the lands, the frame body, the die pad, the lands and the first and second thinned portions are all made of a single metal plate, the semiconductor device comprising:
 a semiconductor chip being mounted on the die pad and having a plurality of electrode pads;
 a plurality of connection members, each one of said plurality of connection members electrically connecting each one of said plurality of lands to associated one of the electrode pads of the semiconductor chip; and
 a resin encapsulant for molding the semiconductor chip, the connection members, a first upper half corresponding to the first part of the die pad protruding out of the frame body, and respective second upper halves corresponding to the second parts of the lands protruding out of the frame body,
 wherein a first lower half, which is the remaining portion of the die pad other than the first upper half, and second lower halves, each of which is the remaining portion of associated one of the lands other than associated one of the second upper halves, are not covered with the resin encapsulant but protrude downward out of the lower surface of the resin encapsulant, and
 the first lower half and the second lower halves have a recess part depressing inwardly from the frame body.

10. The device of claim 9, wherein the top face of the first upper half of the die pad, which is buried in the resin encapsulant, is greater in area than the bottom face of the first lower half thereof, and the top face of the first upper half has curved edges, and
 wherein the top face of the second upper half of each said land, which is buried in the resin encapsulant, is greater in area than the bottom face of the second lower half thereof, and the top face of the second upper half has curved edges.

11. A resin-molded semiconductor device formed by using a terminal land frame, the terminal land frame including:
 a metallic frame body;
 a plurality of lands, each one of said plurality of lands being substantially as thick as the frame body, at least part of each one of said plurality of lands having a projection protruding out of the frame body and a recess part depressing inwardly from the frame body formed by pressing on the opposite side of the projection; and a plurality of thinned portions, each one of said plurality of thinned portions having a thickness of 10% to 30% of the thickness of the frame body and connecting the frame body to associated one of the lands, the frame body, the lands and the thinned portions are all made of a single metal plate, the semiconductor device comprising:
 a semiconductor chip being mounted on the lands and having a plurality of electrode pads connected to the lands; and
 a resin encapsulant for molding the semiconductor chip and respective upper halves of the lands, each said upper half corresponding to the part of the associated land that protrudes out of the frame body,
 wherein a lower half of each one of said plurality of lands other than the upper half thereof is not covered with the resin encapsulant but protrudes downward out of the lower surface of the resin encapsulant.

12. The device of claim 11, wherein the top face of the upper half of each said land, which is buried in the resin encapsulant, is greater in area than the bottom face of the lower half thereof, and the top face of the upper half has curved edges.

13. The device of claim 11, further comprising:
 the same number of protruding electrodes as that of the electrode pads of the semiconductor chip, each said protruding electrode being formed on associated one of the electrode pads; and
 a conductive adhesive for electrically connecting the protruding electrodes to the lands.

14. A terminal land frame comprising:
 a frame body;
 a plurality of lands, each one of said plurality of lands being substantially as thick as the frame body, at least part of each one of said plurality of lands having a projection protruding out of the frame body and a recess part depressing inwardly from the frame body formed by pressing on the opposite side of the projection; and a plurality of thinned portions, each one of said plurality of thinned portions having a thickness of 10% to 30% of the thickness of the frame body and connecting the frame body to associated one of the lands, wherein the frame body, the lands and the thinned portions are all made of a single metal plate, and wherein when each one of said plurality of lands is pressed in a direction in which the land protrudes, associated one of the thinned portions is fractured and the land is separable from the frame body, and the part of each one of said plurality of lands protruding out of the frame body remains in a resin encapsulant of a resin-molded semiconductor device.

15. The terminal land frame of claim 14, wherein at least one of the lands function as an external electrode.

16. The terminal land frame of claim 14, wherein at least one of the lands function as a die pad.

* * * * *